(12) United States Patent
Huang

(10) Patent No.: US 10,892,355 B2
(45) Date of Patent: Jan. 12, 2021

(54) LATERAL FIN STATIC INDUCTION TRANSISTOR

(71) Applicant: HRL Laboratories, LLC, Malibu, CA (US)

(72) Inventor: Biqin Huang, Torrance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/281,727

(22) Filed: Feb. 21, 2019

(65) Prior Publication Data

US 2019/0189791 A1 Jun. 20, 2019

Related U.S. Application Data

(62) Division of application No. 15/896,048, filed on Feb. 13, 2018, now Pat. No. 10,367,086.
(Continued)

(51) Int. Cl.
*H01L 29/772* (2006.01)
*H01L 29/16* (2006.01)
(Continued)

(52) U.S. Cl.
CPC ........ *H01L 29/7722* (2013.01); *H01L 21/761* (2013.01); *H01L 29/0646* (2013.01); *H01L 29/0657* (2013.01); *H01L 29/0843* (2013.01); *H01L 29/1029* (2013.01); *H01L 29/16* (2013.01); *H01L 29/1602* (2013.01); *H01L 29/165* (2013.01); *H01L 29/167* (2013.01); *H01L 29/1608* (2013.01);
(Continued)

(58) Field of Classification Search
CPC ............. H01L 29/7722; H01L 29/1602; H01L 29/1608; H01L 29/66045; H01L 29/66068; H01L 29/0843
See application file for complete search history.

(56) References Cited

U.S. PATENT DOCUMENTS 6,764,884 B1 7/2004 Yu et al.
2009/0146186 A1 6/2009 Kub et al.
(Continued)

FOREIGN PATENT DOCUMENTS

JP 2006-216716 8/2006

OTHER PUBLICATIONS

International Preliminary Report on Patentability Chapter II issued for PCT/US2018/034462 dated Jul. 12, 2019 (indicated as "Pending processing").
(Continued)

*Primary Examiner* — Dung A. Le
(74) *Attorney, Agent, or Firm* — Ladas & Parry

(57) ABSTRACT

Presented is a lateral fin static induction transistor including a semi conductive substrate, source and drain regions extending from an optional buffer layer of same or varied thickness supported by the semi conductive substrate, a semi conductive channel electrically coupling the source region to the drain region of the transistor, a portion of the semi conductive channel being a fin and having a face covered by a gated structure, thereby defining a gated channel within the semi conductive channel, the semi conductive channel further including a drift region electrically coupling the gated channel to the drain region of the transistor.

14 Claims, 23 Drawing Sheets

Related U.S. Application Data

(60) Provisional application No. 62/519,721, filed on Jun. 14, 2017.

(51) Int. Cl.

| | | |
|---|---|---|
| *H01L 29/66* | (2006.01) | |
| *H01L 29/10* | (2006.01) | |
| *H01L 29/812* | (2006.01) | |
| *H01L 29/167* | (2006.01) | |
| *H01L 29/06* | (2006.01) | |
| *H01L 21/761* | (2006.01) | |
| *H01L 29/165* | (2006.01) | |
| *H01L 29/08* | (2006.01) | |
| H01L 29/78 | (2006.01) | |

(52) U.S. Cl.
CPC .. *H01L 29/66045* (2013.01); *H01L 29/66068* (2013.01); *H01L 29/812* (2013.01); *H01L 29/0673* (2013.01); *H01L 29/785* (2013.01)

(56) References Cited

U.S. PATENT DOCUMENTS

| | | | |
|---|---|---|---|
| 2010/0078715 A1* | 4/2010 | Lee | H01L 29/66704 257/330 |
| 2011/0186862 A1* | 8/2011 | Harada | H01L 21/324 257/77 |
| 2013/0187242 A1 | 7/2013 | Tan et al. | |
| 2015/0228727 A1* | 8/2015 | Kato | H01L 29/808 257/77 |
| 2015/0263173 A1 | 9/2015 | Lue | |
| 2016/0133696 A1 | 5/2016 | Yin et al. | |
| 2018/0012967 A1* | 1/2018 | Kang | H01L 29/785 |

OTHER PUBLICATIONS

Office Action issued for U.S. Appl. No. 15/896,048 dated Jan. 11, 2019.

Office Action issued for U.S. Appl. No. 15/896,048 dated Sep. 6, 2018.

U.S. Appl. No. 15/896,048, Huang, filed Feb. 13, 2018.

A. Aleksov, et al. "Diamond field effect transistors-concepts and challenges," Diamond and Related Materials, vol. 12, Issues 3-7, Mar.-Jul. 2003, pp. 391-398.

International Search Report for PCT/US18/34462 dated Sep. 17, 2018.

Written Opinion of the ISA for PCT/US18/34462 dated Sep. 17, 2018.

Booske, J. H., "Plasma physics and related challenges of millimeter-wave-to-terahertz and high power microwave generation," Physics of Plasmas, vol. 15, pp. 055502-1 to 055502-16, 2008.

Hiraiwa, A., et at. "Blocking characteristics of diamond junctions with a punch-through design," J. Appl. Phys., vol. 117, pp. 124503-1 to 124503-6, 2015.

Landstrass, M. I., et al. "Hydrogen passivation of electrically active defects in diamond," Appl. Phys. Lett., vol. 55, pp. 1391-1393, 1989.

Gulyaev, Y, V.. et al., "PET on Hydrogenated Diamond Surface," Journal of Communications Technology and Electronics, vol. 59, No. 3, pp. 282-287, 2014.

Russell, S., et al. "RF Operation of Hydrogen-Terminated Diamond Field Effect Transistors: A Comparative Study," IEEE Transactions on Electron Devices, vol. 62, No. 3, pp. 751-756, Mar. 2015.

Hiraiwa, A., et al. "Refractory two-dimensional hole gas on hydrogenated diamond surface," J. Appl. Phys., vol. 112, pp, 124504-1 to 124504-6, 2012.

El-Hajj, H., et al. "Diamond MISFET based on boron delta-doped channel," Diamond and Related Materials, vol. 17, pp. 1259-1263, (2008).

Edgington, R., et al. "Growth and electrical characterisation of δ-doped boron layers on (111) diamond surfaces," J. Appl. Phys., vol. 111, pp. 033710-1 to 033710-7, 2012.

Balmer, R. S. et al. "Transport behavior of holes in boron delta-doped diamond structures," J. Appl. Phys., vol. 113, pp. 033702-1 to 033702-10, 2013.

Kovi, K., et al. "Inversion in Metal—Oxide-Semiconductor Capacitors on Boron-Doped Diamond," IEEE Electron Device Letters, vol. 36, No. 6, pp. 603-605, Jun. 2015.

Matsumoto, T., et al. "Inversion channel diamond metal-oxide-semiconductor field-effect transistor with normally off characteristics." Scientific Reports, vol. 6, pp. 1-6, Aug. 2016.

Colinge, J. P., et al. "Conduction mechanisms in thin-film accumulation-mode SOI p-channel MOSFETs," IEEE Trans. on Electron Devices, vol. 37, No. 3, pp. 718-723, Mar. 1990.

Yokota, Y., et al. "Device Operation of $p^+$-i-$p^+$Diamond Metal-Insulator-Semiconductor Field-Effect Transistors on Heteroepitaxial Diamond Films Grown on Ir (100)/MgO (100)," New Diamond and Frontier Carbon Technology, vol. 17, No. 4, pp. 211-217, 2007.

Kawakami, N., et al. "Device operation of p-i-p type diamond metal-insulator—semiconductor field effect transistors with sub-micrometer channel," Diamond and Related Materials, vol. 14, pp. 509-513, 2005.

Hisamoto, D. et al. "FinFET—a IEEE Transactions on Electron self-aligned double-gate MOSFET scalable to 20 nm," Devices, vol. 47, No. 12, pp. 2320-2325, Dec. 2000.

Liu, J., et al. "Design and fabrication of high-performance diamond triple-gate field-effect transistors," Scientific Reports, vol. 6, pp. 1-8, Oct. 2016.

Hu, C. C. *Modern Semiconductor Devices for Integrated Circuits*, Pearson, p. 162, 2009.

Rashid, S. J. et al. "Numerical Parameterization of Chemical-Vapor-Deposited (CVD) Single-Crystal Diamond for Device Simulation and Analysis," IEEE Transactions on Electron Devices, vol. 55, No. 10, pp. 2744-2756, Oct. 2008.

Ortiz-Conde, A. et al. "Revisiting MOSFET threshold voltage extraction methods," Microelectronics Reliability, vol. 53, pp. 1-15, 2013.

P. Richman, "Modulation of space-charge-limited current flow in insulated-gate field-effect tetrodes," IEEE Transactions on Electron Devices, vol. 16, pp. 759-766, 1969.

B. Wilamowski, "The Punch-Through Transistor with MOS Controled Gate," physica status solidi (a), vol. 79, pp. 631-637, 1983.

J. Nishizawa, T. Terasaki, and J. Shibata, "Field-effect transistor versus analog transistor (static induction transistor)," IEEE Transactions on Electron Devices, vol. 22, pp. 185-197, 1975.

Jean-Pierre Colinge et al, "Nanowire transistors without junctions", Nature Nanotechnology, vol. 5, Mar. 2010.

Yinghui Shan et al, "Unipolar accumulation-type transistor configuration implemented using Si nanowires", Applied Physics Letters, 91, 2007.

Xuejue Huang; Wen-Chin Lee; Kuo, C. ; et al. "Sub-50 nm P-channel FinFET" (PDF). IEEE Transactions on Electron Devices. 48 (5): 880-886. doi:10.1109/16.918235, May 2001.

Chenming Hu; Bokor J.; et al. "FinFET—a self-aligned double-gate MOSFET scalable to 20 nm". IEEE Transactions on Electron Devices. 47 (12): 2320-2325. doi:10.1109/16.887014, Dec. 2000.

Wilson, D. ; Hayhurst, R.; Oblea, A. ; Parke, S. ; Hackler, D. "Flexfet: Independently-Double-Gated SOI Transistor With Variable Vt and 0.5V Operation Achieving Near Ideal Sub-threshold Slope" SOI Conference, 2007 IEEE International Archived Apr. 3, 2015.

\* cited by examiner

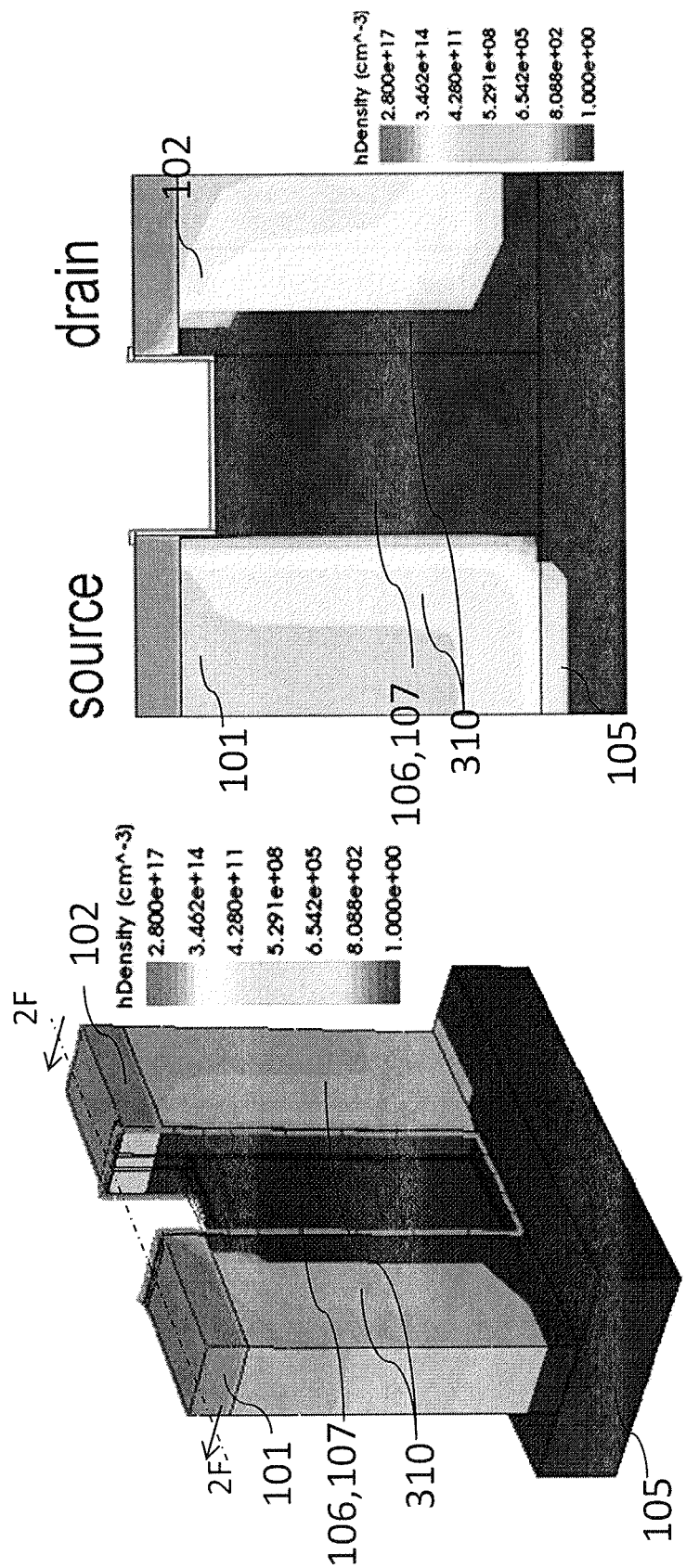

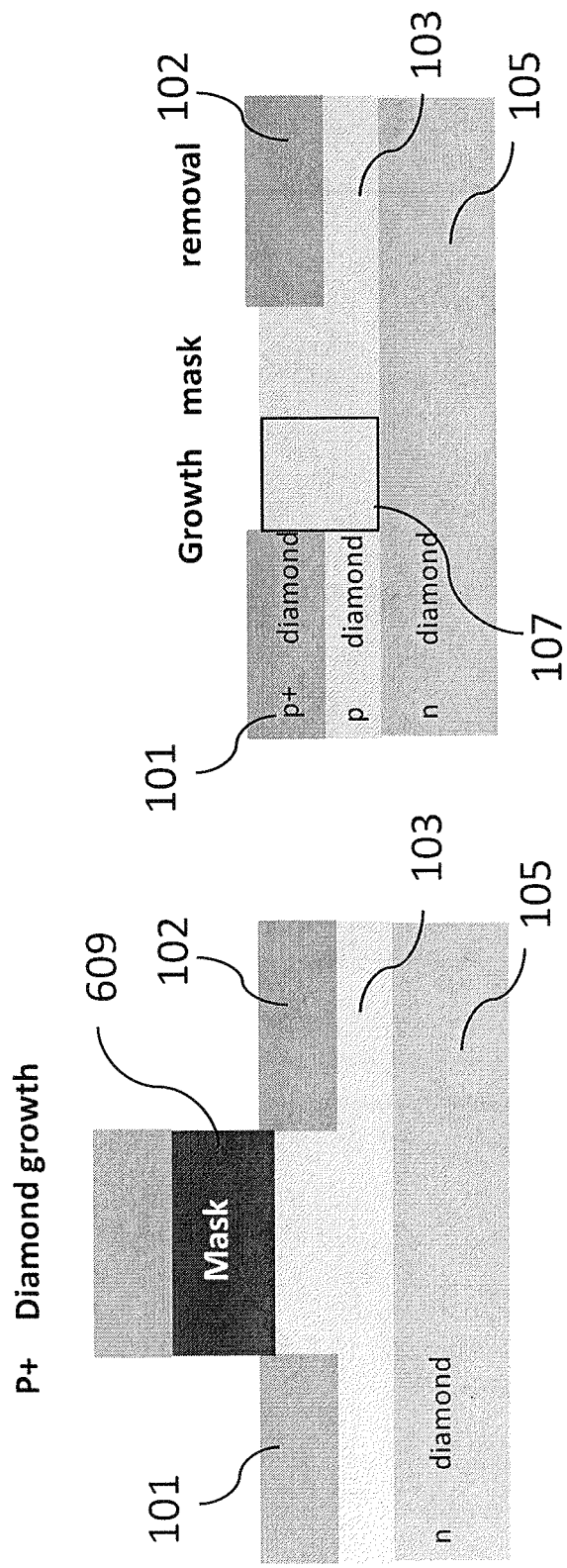

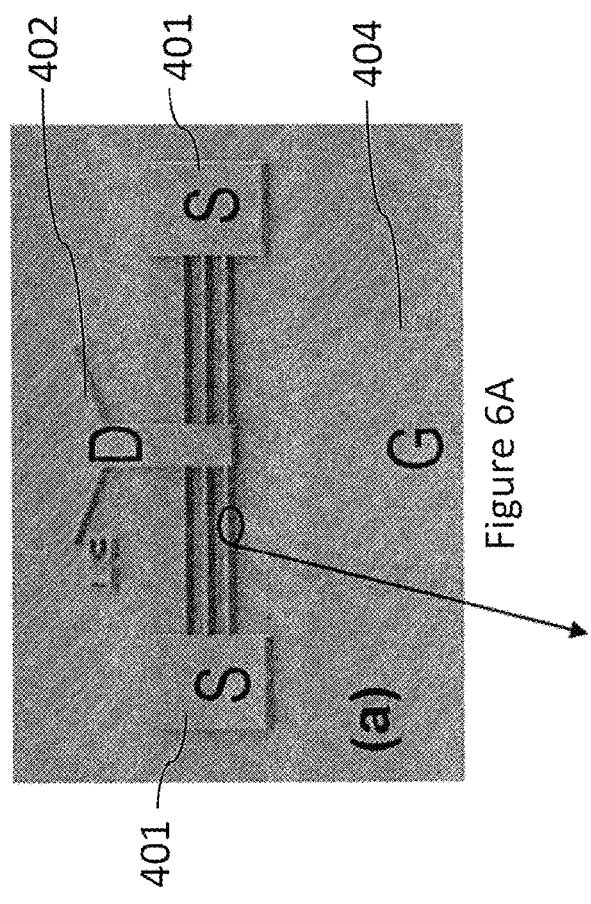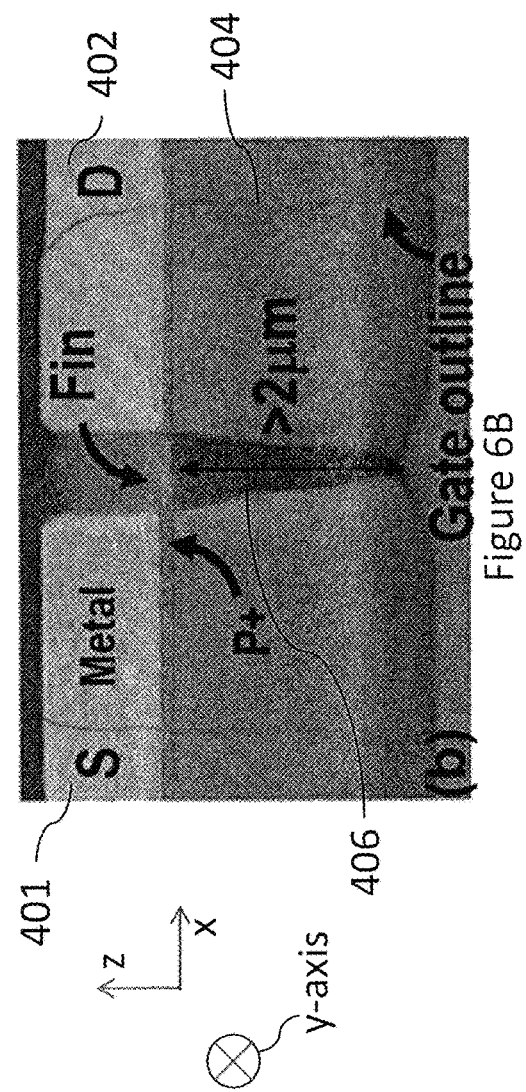
Figure 6A
Figure 6B

LATERAL FIN STATIC INDUCTION TRANSISTOR

CROSS REFERENCE TO RELATED APPLICATIONS

This non-provisional application claims the benefit of and is a divisional of U.S. patent application Ser. No. 15/896,048 filed on Feb. 13, 2018, which claims the benefit of U.S. Provisional Application No. 62/519,721 filed on Jun. 14, 2017, which are incorporated herein by reference. This application is also related to the attached appendix to the specification entitled "Diamond FinFET without Hydrogen Termination," the disclosure of which is incorporated herein by reference.

STATEMENT REGARDING FEDERALLY SPONSORED RESEARCH

None

TECHNICAL FIELD

The present writing is directed to the field of semiconductors, and in particular, to transistors comprising diamond. The technology presented herein, is applicable to devices and systems that utilize gate structures to control the source-to-channel barrier in diamond electronics and otherwise.

REFERENCES TO NON-PATENT LITERATURE

The following references are incorporated by reference.
[1] P. Richman, "Modulation of space-charge-limited current flow in insulated-gate field-effect tetrodes," IEEE Transactions on Electron Devices, vol. 16, pp. 759-766, 1969.
[2] B. Wihimowski, "The Punch-Through Transistor with MOS Controlled Gate," physica status solidi (a), vol. 79, pp. 631-637, 1983.
[3] J. Nishizawa, T. Terasaki, and J. Shibata, "Field-effect transistor versus analog transistor (static induction transistor)," IEEE Transactions on Electron Devices, vol. 22, pp. 185-197, 1975.
[4] Xuejue Huang; Wen-Chin Lee; Kuo, C.; et al., "Sub-50 nm P-channel FinFET" (PDF). IEEE Transactions on Electron Devices. 48 (5): 880-886. doi:10.1109/16.918235, May 2001.
[5] Chenming fHu; Bokor, J.; et al. "FinFET—a self-aligned double-gate MOSFET scalable to 20 nm". IEEE Transactions on Electron Devices. 47 (12): 2320-2325. doi: 10.1109/16.887014, December 2000.
[6] Wilson, D.; Hayhurst, R.; Oblea, A.; Parke, S.; Hackler, D. "Flexfet: Independently-Double-Gated SOI Transistor With Variable Vt and 0.5V Operation Achieving Near Ideal Subthreshold Slope" SOI Conference, 2007 IEEE International Archived Apr. 3, 2015.

BACKGROUND

Diamond-based electronics have been attractive for decades due to the intrinsic characteristics of diamond materials. With a breakdown field of at least 6 MV/cm, an electron and hole mobility greater than 2000 $cm^2/V/s$, and a thermal conductivity greater than 20 W/cm/K, diamond transistors will continue to significantly improve the power performance of solid state radio frequency (RF) electronics, benefiting electronic systems such as, for example, phased-array radar systems, electric automobiles, and the electric power grid. Simplified thermal management and size, weight, and power (SWAP) improvements enabled by diamond technology can potentially facilitate the application of diamond electronics to high-power, solid-state, RF systems and mobile platforms such as satellites/drones.

Despite its notable properties, in terms of its development in the electronics industry, diamond has not been able to compete with other wide-band gap materials in the past due to several limitations. One limitation includes material availability, as the average size of diamond samples is typically small. However, advancements in microwave plasma chemical vapor deposition (CVD) growth technology have resulted in the availability of larger diamond samples. A second limitation includes the lack of suitable dopants for diamond, though P-type dopants such as boron are readily available. However, since boron has a relatively high activation energy of 0.36 eV, boron is particularly unsuitable for certain applications. N-type doping in diamond has been researched for decades without many significant improvements. Without overcoming these challenges, diamond electronics may never become a mainstream technology.

In consideration of these limitations and leveraging the notable properties of diamond, the technology herein presented comprises in one embodiment, a lateral, fin-based, static induction transistor (SIT) comprising diamond. SITs were introduced decades ago and they are currently used in silicon carbide (SiC) technologies. Almost all of these technologies use vertical structures with large device areas. Unfortunately, the parasitic capacitance between the gate and drain, limits the device operation in high frequency regimes. Using a lateral SIT, such as a lateral punch-through transistor, can simplify the engineering of parasitic components for high-frequency operations. However, ensuring that the device channel is properly isolated from the substrate is a big challenge when the channel comprises wide-band gap materials. Most lateral SITs have been engineered using silicon technology, where good device channel isolations are possible through a P-N junction or through silicon-on-insulator (SOI) technology. The lack of channel isolations at high voltages in lateral devices was of consideration in developing the present technology, and it is thought that by introducing a fin-based channel with an additional buffer layer to isolate the device from a semi conductive substrate, that problem may be resolved or lessened to a notable extent.

BRIEF DESCRIPTION OF THE INVENTION

The technology now presented is comprised of transistors using multi-gate structures operating in the space charge limited regime. The use of a multi-gate structure increases a current leakage path distance, thereby increasing the breakdown voltage of a transistor without sacrificing its current conduction capability.

The term "fin" as here used defines a channel with a thin cross-sectional area relative to a corresponding cross-sectional area of a source and/or drain of the transistor. The fin can extend along a current path distance between the source and drain of the transistor. The thin cross-sectional area of the fin can remain generally constant along the current path distance, or it can vary within a range of thin cross-sectional areas along the current path distance. The fin can be a nanowire fin.

In this writing, a P-type semiconductor is a semiconductor having holes as the majority charge carriers. A P-type semiconductor can be an extrinsic or intrinsic semiconductor, and if extrinsic, the P-type semiconductor is doped with a P-type dopant. A P-type dopant is a dopant that, when added to a semiconductor, increases the positive charge carrier (e.g. hole) concentrations therein.

In this writing, an N-type semiconductor is a semiconductor having electrons as the majority charge carriers. An N-type semiconductor can be an extrinsic or intrinsic semiconductor, and if extrinsic, the N-type semiconductor is doped with an N-type dopant. An N-type dopant is a dopant that, when added to a semiconductor, increases the negative charge carrier (e.g. electron) concentrations therein.

In this writing, a multigate device, multiple gate device, or multiple gate field-effect transistor can be a Fin Field-effect transistor (FinFet) that incorporates more than one gate into a single device. The multiple gates can be controlled by a single, integral gate structure, wherein the multiple gate surfaces act electrically as a single gate, or by independent, distinct gate structures. (This information is to be considered noting that a planar double-gate transistor is one in which the drain, source and channel are sandwiched between two independently fabricated gate/gate-oxide stacks. A FlexFet is a planar, independently double-gated transistor with a damascene metal top gate MOSFET and an implanted JFET (junction gate field-effect transistor) bottom gate that are self-aligned in a gate trench, both as described in reference [6] above.)

In this writing, the description "intrinsic" refers to a semiconductor that is not doped. For example, "intrinsic diamond" refers to undoped diamond.

In this writing, a "pinch off" voltage refers to a gate bias voltage threshold at which the transistor turns off. A current "pinch off" refers to the act of a current shutting off at the "pinch off" voltage.

In this writing a "short-gated channel" refers to a short channel length such as between a source and a drain. The gate to drain separation can be adjusted for different materials and the use and non use of buffer layers.

In this writing, a "breakdown voltage" can refer to the voltage difference between the drain and the source at which the device begins to leak current through the drain or source when the gate voltage is such that the channel is "off".

In this writing a good ohmic contact is an ohmic contact with a low ohmic contact resistance. A low ohmic contact resistance is an ohmic contact resistance that is less than 10 Ω*mm.

In consideration of one or more of the above-noted deficiencies, an embodiment here presented provides a transistor having source and drain regions, the transistor comprising a semi conductive channel electrically coupling the source and drain regions, a portion of the semi conductive channel comprising a fin, the fin being covered by a gate structure to define a gated channel, the semi conductive channel further comprising a drift region coupling the gated channel to the drain region.

Another embodiment provides a transistor having source and drain regions, the transistor comprising a semi conductive channel electrically coupling the source and drain regions, a portion of the semi conductive channel comprising a plurality of (i.e. at least two) fins covered by a gate structure thereby defining gated channels within the semi conductive channel, the semi conductive channel further comprising a drift region coupling the gated channels to the drain region.

A further embodiment involves a diamond-based, lateral transistor device with a fin-like channel, the device comprising: a gated channel and a drift region, the gated channel located in the fin-like channel near the drift region, the drift region located in the fin-like channel, wherein the current transport through the drift region is space-charge limited, the drift region determining the device breakdown voltage of the transistor.

A method of making a transistor is also disclosed herein and comprises forming heavily doped P+ diamond regions on a semi conductive channel to create source and drain regions of the transistor; forming a lightly doped P− region on the channel; dry etching and/or using electron beam lithography on the lightly doped P− regions to form a fin channel; depositing a gate dielectric material on the fin channel to cover a surface thereof; and forming a gate contact on the gate dielectric material.

In a first aspect, the transistor presented in this writing and the method of making it has a fin, which can be semi conductive and can be doped at the same or similar doping levels as other regions of a semi conductive channel to which it relates. The fin can be completely or partially surrounded by the gate structure. The fin can have multiple surfaces or faces. The gate structure can cover one or more faces or surfaces of the fin. The faces or surfaces of the fin can comprise the top, side, and/or bottom surfaces or faces of the fin coupled between the source and drain regions of the transistor. The foregoing description can apply to a transistor comprising a multiple number of fins.

In a second aspect, increasing drift region conduction is of interest. Increasing drift region conduction can comprise: reducing the drift region length of the semi conductive channel (i.e. the gate-to-drain separation distance) and increasing a thickness of the drift region channel. The dimensions of the drift region (i.e. length, width, and/or thickness) can determine the breakdown voltage of the device.

In a third aspect, reducing the substrate punch-through effect is of interest. Reducing the substrate punch-through effect can comprise: incorporating a semi conductive buffer layer between the source/drain regions and a substrate on which the transistor is placed and increasing the size and/or thickness of the buffer layer.

In a fourth aspect, the large parasitic capacitance inherent in vertical SITs is of interest and addressed to be reduced or overcome. By incorporating a lateral structure, the gate-to-source and gate-to-drain parasitic capacitance can be engineered with greater freedom, thereby enabling a higher frequency of operation and a higher power performance. In existing lateral SITs, there is a lack of efficient methods to turn the conductive channel "off" at high voltages, leading to a lower breakdown voltage and lower powers of operation. Using a multiple gate structure, the conduction channel can be regulated by wrapping a gate around the sides of the channel. This multiple gate design enables a material agnostic SIT, which is ideal for use in material systems comprising diamond, since diamond systems often lack good hetero junctions and homo junctions to control leakages therein.

In a fifth aspect, leveraging a multiple gate structure configured to decouple the current paths for conduction and leakage is of interest. This effectively increases the device breakdown voltage without reducing the channel conduction, resulting in a higher power performance. The incorporation of a fin structure introduces a larger cross section area for space-charge limited transport in the drift region thereby reducing the drift region resistance. This arrangement can enable a high conduction channel.

BRIEF DESCRIPTION OF THE DRAWINGS

To better understand the technology and methodology herein presented, reference is made to the following description taken in conjunction with the accompanying drawings in which like reference numerals represent like parts. The drawings are not drawn to scale.

FIGS. 2A-2F illustrate a distribution of hole concentrations for a simulated operation in three dimensions, of an embodiment of the technology herein presented.

FIG. 2AA illustrates a variation of the cross sectional view shown in FIG. 1C.

FIG. 2BB is identical to FIG. 2AA except that gated channel 106, buffer layer 310, and drift region 307 are noted.

FIGS. 5A-5D illustrate a methodology for fabricating a transistor, according to an embodiment herein presented.

FIGS. 6A and 6B illustrate scanning electron microscope images of a transistor, according to an embodiment herein presented.

BRIEF DESCRIPTION OF THE APPENDIX

Appendix A is a presently unpublished article by the inventor of the subject technology. This article is incorporated herein by reference. To the extent material in the article contrasts with the description herein, the statements and presentations made in the article are to control, as the material in the article is the latest information pertaining to the inventive concepts here presented.

DETAILED DESCRIPTION

The present technology involves a lateral, multiple-gate, transistor operating within a space charge limited system. The technology uses a multiple gate structure to control the source-to-channel barrier in order to control the injection of charge carriers into the channel for current transport in the space charge limited system. The use of a multiple-gate structure seems to increase the leakage path thereby increasing the breakdown voltage without sacrificing the current conduction capability of the transistor. As will be seen, the present technology may be used with single gate structures as well.

Figure 1A:
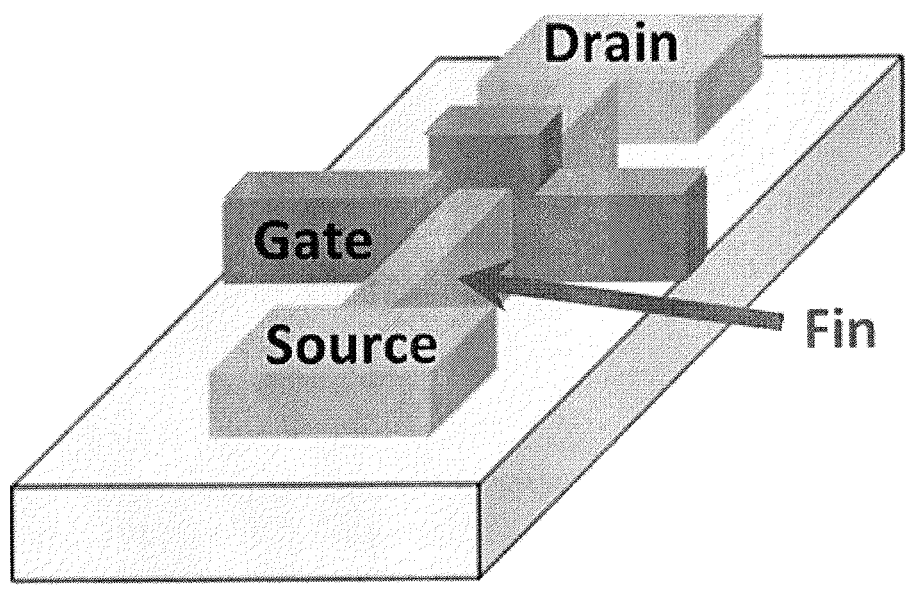
FIG. 1A is a perspective view of a non-planar, double gate FinFET (Fin Field-Effect Transistor).

Turning to FIG. 1A, prior art background information is provided. As described in references [4] and [5] above, the term FinFET refers generally to a non-planar, double-gate transistor built on a substrate of the type seen in FIG. 1A with the fin extending between the source and the drain. The term 'FinFET' can refer to multiple-gate as well as single gate structures. The FinFET is a variation on traditional MOSFETs (metal-oxide field effect transistor) distinguished by the presence of a thin silicon 'fin' inversion channel on top of a substrate, allowing the gate to make (at least) two points of contact: the left and right sides of the fin. The length of the fin (measured in the direction from the source to the drain) determines the effective channel length of the device. A wrap-around gate structure provides better electrical control over the channel and thus helps in reducing the leakage current and overcoming other short-channel effects.

The use of multigate transistors is one strategy being developed to create ever smaller microprocessors and memory cells and is referred to often as extending Moore's law. Silicon digital circuits have continually advanced the computing front by following Moore's Law in reducing energy consumption and increasing computing power by relentlessly scaling the transistor.

The thinking underlying the present technology is that a different approach is needed at least for RF and power electronics to increase power performance as higher breakdown fields are needed to increase power density. Ohmic gate dielectric engineering is tested in the technology now presented.

Device concepts such as FinFETs, junctionless FETs, and unipolar nanowire FETs developed in the silicon industry to create a fin or nanowire-type structure with the gate wrapping around the channel provide much better channel control especially for short-channel devices required for RF operation. Fin-like geometry was recently reported in H (hydrogen)-terminated diamond FET but the demonstrated device requires H-termination and does not use fins as active device channels. Instead the fin-based geometry was used purely to increase the conductive surface area and thereby increase device current. In the present technology, active fin channels made in diamond are fully utilized without H-termination, enabling the leveraging of thicker diamond films with much better quality and the maintenance of channel control for unipolar transport at the sub-micron scale. Fin geometry offers an additional degree of freedom to increase the current density by reducing the fin channel pitch and increasing the fin height enabling a high, power-density device for RF and power electronics. The device discussed now operates with hole accumulation metal-oxide semiconductor (MOS) structures built on fins to maintain effective control of the channel conduction.

Succinctly stated, the technology now presented offers fin geometry with space charge limited current transport. For at least diamond, this seems to be a very advantageous combination.

Figure 1B:
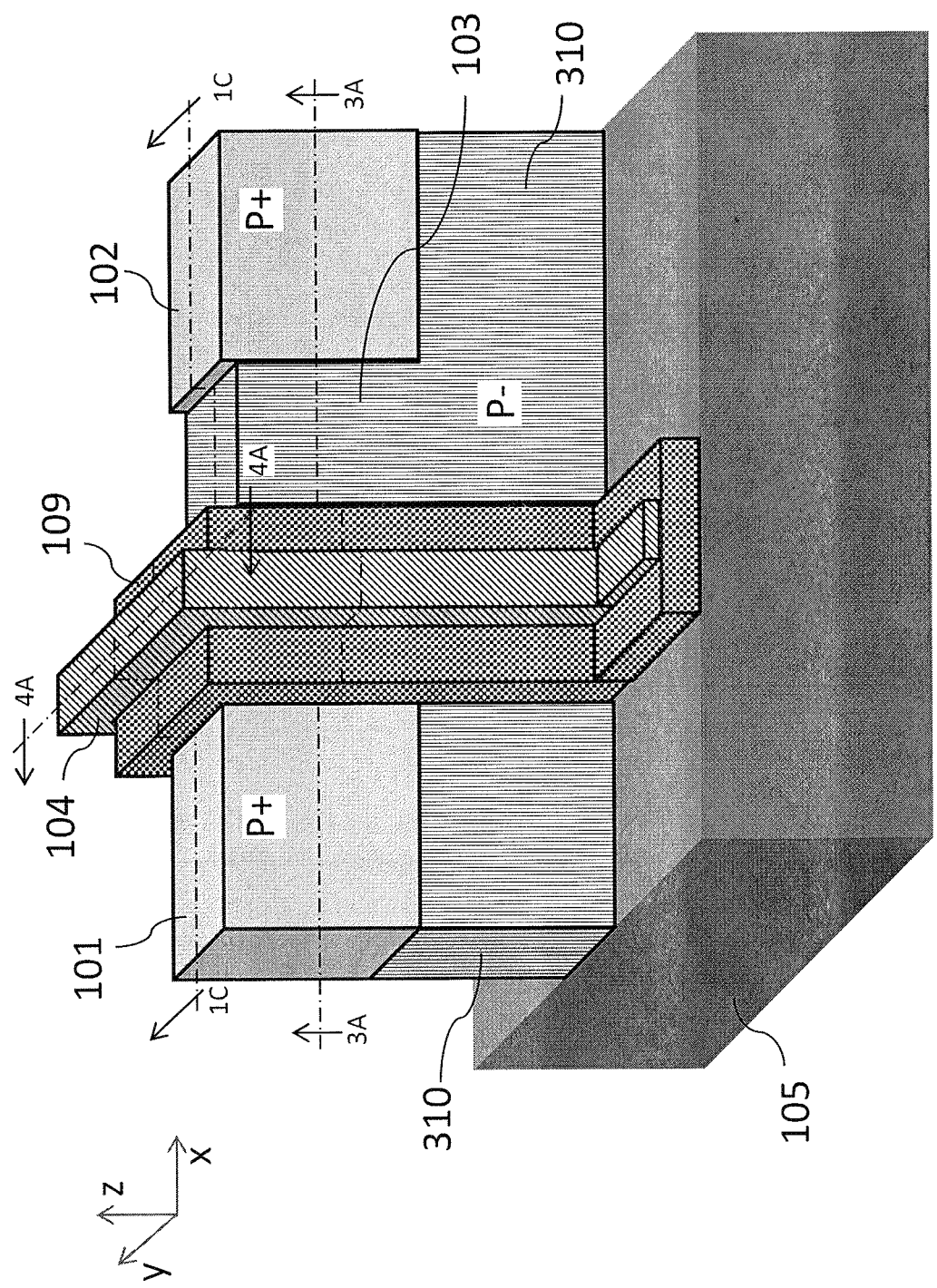
FIG. 1B illustrates a perspective view of a transistor according to an embodiment herein presented.

Turning to FIG. 1B, a perspective view of an embodiment of a lateral fin SIT is shown. FIG. 1B presents the source 101, the drain 102, the channel (including fin and drift region) 103, the gate structure 104, the dielectric layer 109, the buffer layer 310, and the substrate 105 of the lateral fin SIT. Axes x, y, and z are labeled for the reader's reference. Given these axes, the term "length" refers to a distance measured along the x-axis exemplified in FIG. 1B. Similarly, the terms "width" and "thickness" refer to distances measured along the y-axis and the z-axis, respectively.

Channel 103 and buffer layer 310 can comprise lightly doped regions of P-type diamond to enable control of the channel conductivity. Source 101 and drain 102 can comprise heavily doped regions of P-type diamond to reduce the ohmic contact resistance introduced by ohmic contacts (not shown) coupled to source 101 and drain 102. (Contact resistance is a measure of the ease with which current can flow across a metal-semiconductor interface.) This ohmic contact resistance can be reduced to less than 10 Ω mm with sufficiently high P-type dopant concentrations in the source 101 and drain 102 regions. Source 101 and drain 102 can comprise heavily doped regions of P-type diamond to enable a high power and a high frequency operation.

Heavily doped P-type diamond can comprise diamond doped with a P-type dopant (e.g. boron) concentration greater than or equal to $10^{19}$ cm$^{-3}$. Lightly doped P-type diamond can comprise diamond doped with a P-type dopant (e.g. boron) concentration ranging between $10^{15}$ cm$^{-3}$ and $10^{18}$ cm$^{-3}$ The unit of "cm$^{-3}$" refers to a number of atoms (of e.g. boron) per cubic centimeter.

As seen in FIG. 1B, source 101, drain 102, channel 103, buffer layer 310, dielectric layer 109, and gate structure 104 are disposed atop substrate 105. Substrate 105 preferably comprises N-type diamond and/or intrinsic diamond to reduce substrate current leakage therethrough. N-type diamond can comprise diamond doped with an N-type dopant (e.g. phosphorus, nitrogen). Substrate 105 can be doped at any suitable N-type dopant concentration.

Figure 1C:
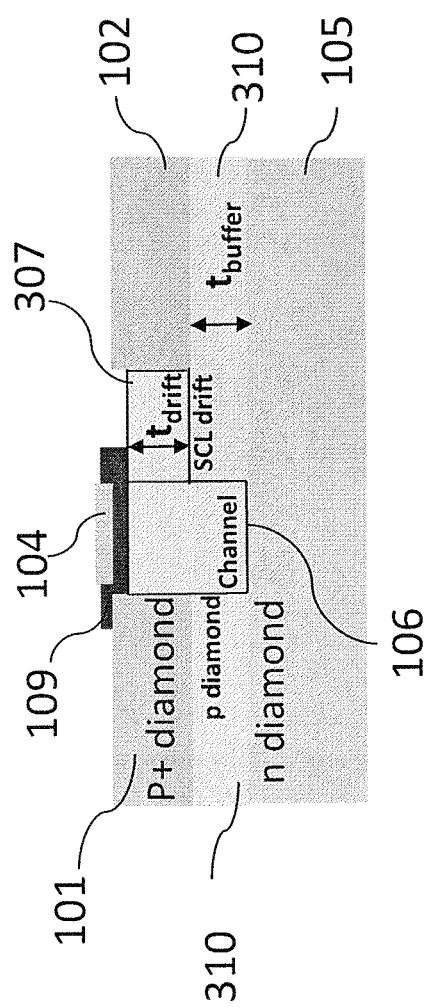
FIG. 1C illustrates a cross sectional view taken along line 1C-1C of FIG. 1B.

Next, FIG. 1C presents a cross sectional view of the transistor along line 1C-1C of FIG. 1B, with source 101, drain 102, channel 103, dielectric layer 109, and gate structure 104 disposed atop substrate 105. FIG. 1C does not label channel 103 though it should be understood that channel 103 comprises gated channel 106 and drift region 307 which are shown in FIG. 1C. Typical Finfets do not have drift regions. Drift regions are useful for wide-band gap materials and silicon. The width of the drift region is independent of the channel width.

Figure 1D:
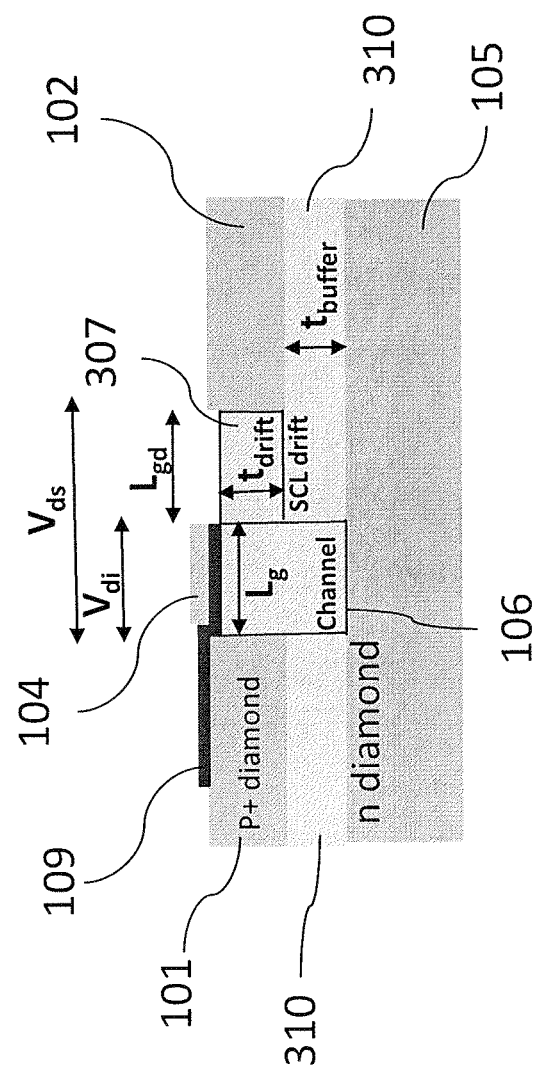
FIG. 1D illustrates a variation of the cross sectional view shown in FIG. 1C.

Turning now to FIG. 1D, the device geometry and relevant dimensions are identified by suitable legends. FIG. 1D is a variation of the cross section shown in FIG. 1C. Dielectric layer 109 is shown to cover a larger surface area of source 101 than what is shown in FIG. 1C, though the amount of dielectric layer 109 covering source 101 is not critical. Gated channel 106 is a fin-like structure formed of the lightly doped P-type diamond region discussed above. (Gate structure 104 can be either a multiple gate structure or a single gate structure formed on at least one, two, or three faces of gated channel 106 (the top and two opposing sides of gated channel 106. The gate structure should be formed on the gated channel in whatever manner is needed to facilitate pinching off the current in that channel if desired.) The source 101, and drain 102 regions are preferably comprised of heavily doped P type diamond (shown as P+ in FIG. 1B) to reduce the ohmic contact resistance. The gated channel 106 is separated from the drain 102 by a gap distance Lgd.

The length $L_g$ of gated channel 106 is defined as the channel length underneath the gate structure 104. Heavily doped source 101 and drain 102 regions are separated from the substrate 105 by buffer layer 310. This buffer layer 310 provides additional voltage blockage when the device is "off" and therefore increases the breakdown voltage of the device. For certain applications not requiring a high breakdown voltage, the buffer layer 310 may be omitted. The buffer layer 103 may vary in thickness, being thicker under the drain 102 than the source 101, as just one example. There is an interrelationship between the buffer layer 310 and the channel length. Generally, for greater performance (greater speed), a short channel length is desired. But as the channel length gets shorter and shorter, the electric field between the drain and the source increases. If the channel is extremely short, there will be current leakage. The buffer layer is then needed to prevent this current leakage. If the channel length were greater, performance (speed) would be reduced but also reduced would be leakage and the need for a buffer layer or a buffer layer of notable thickness. Hence, the buffer layer enables the tuning of the device without changing the channel length. A high speed device is anything at or above the gigahertz range.

A conventional semiconductor device requires reasonable dopant densities to operate at its ohmic conductive regions. However, the most common P-type dopant in diamond is boron which has a relatively high activation energy of 0.36 eV, resulting in high resistance/low conduction even at reasonably high doping levels. To increase conduction, a much higher dopant density is necessary though this can reduce the charge carrier mobility and reduce the breakdown voltage of the device.

To achieve a higher power transistor device with both 1) a high device "on" current and 2) a high device "off" breakdown voltage, the design and operation of the device can be adjusted. Instead of relying on its ohmic transport behavior at low electric fields, space charge limited transport can be used and perhaps exploited. When the device gate 104 is biased with a sufficiently high electric field, its conduction is determined by the source of the charge carriers, making the transistor carrier injection limited. If a sufficient amount of charge carriers are able to overcome the source 101/channel 103 barrier, the conduction of channel 103 is eventually limited by the space charge flowing through the drift region 307. In this circumstance, the transistor is described by the space charge limited current (SCLC) regime model. The transistor device, here disclosed, can operate in the space charge limited regime in at least one embodiment.

As appreciated, FIG. 1D defines the lengths and voltage differences across the transistor. This figure becomes important when interpreting the formulas that follow. From this figure, the reader can see the gate dielectric 109 and drift region 307, $L_g$ and $L_{gd}$, which are respectively the gated channel 106 length, and the gate-to-drain separation distance (i.e. the length of the drift region 307). Also presented are voltage differences $V_{di}$ and $V_{ds}$. The voltage difference $V_{di}$ is measured across gated channel 106. The voltage difference $V_{ds}$ is measured across gated channel 106 and drift region 307. Gated channel 106 length $L_g$ is measured along an axis running from the source 101 to the drain region 102 of the transistor.

Figures 1E, 1F:
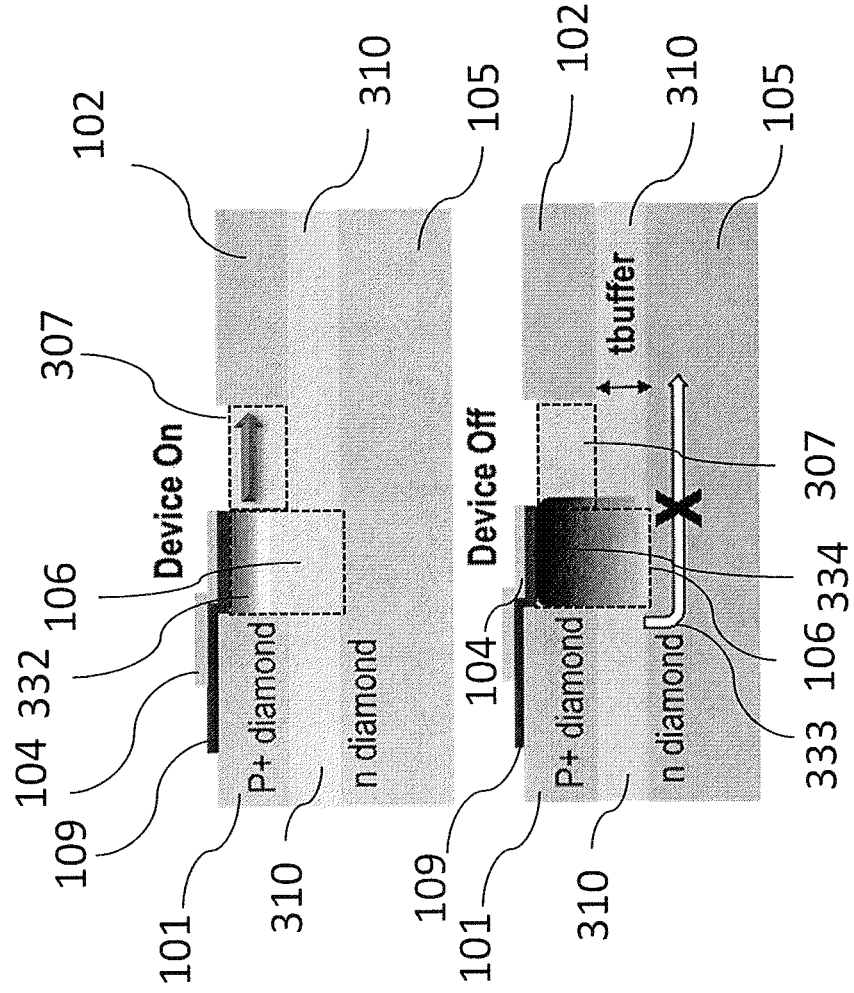
FIGS. 1E and 1F illustrate device properties within a variation of the cross sectional view shown in FIG. 1C.

Looking now at FIGS. 1E and 1F, these figures also illustrate a variation of the cross sectional view shown in FIG. 1C, and are marked with legends showing the device is "on" (Figure E) and the device is "off" (FIG. 1F). FIG. 1E illustrates the concentration of holes 332 and the direction of current (by the arrow pointing toward the drain 102) when the device is "on", and FIG. 1F illustrates the depletion region 334 and the current leakage through the substrate shown by the arrowed line 333 going from the source 101 toward the area under the drain 102 when the device is "off". That leakage can be stemmed as indicated by the X in FIG. 1F across the arrow 333, through the use of buffer layer 310. While in these figures gate structure 104 overlaps the source 101, such overlap is not required. This is especially so for high frequency RF devices. In these devices, an overlap should be eliminated and replaced with a small gap as depicted in FIG. 3B, later discussed.

When the transistor is under a negative gate bias voltage relative to a grounded source 101, the gated channel 106 is populated with positive charge carriers or holes. With a negative gate bias voltage relative to a grounded source 101, the diamond valence band of gated channel 106 is lifted so that the holes form an accumulation layer originating from the source 101, extending through the fin channel 107 best seen in FIGS. 2A through 2F which are described in the following paragraphs.

For devices with short-gated channels 106, the device current density is essentially determined by the hole concentration and the hole saturation velocity. The total channel current can be determined by modeling two sections of the transistor, the gated channel 106 and the drift region 307, as being coupled in series. The gated channel region 106 can be modeled as a normal accumulated MOSFET, as shown below:

$$I_h = \frac{1}{L_g} C_{ox} \mu_h \left( V_g - V_t - \frac{1}{2} V_{di} \right) V_{di} \quad [\text{A/mm}] \qquad \text{Eqn. (1)}$$

The drift region 307 can be modeled as space charge limited transport:

$$I_{df} = 2 * (V_{ds} - V_{di}) * \varepsilon_s * v_s * \frac{t_{drift}}{L_{gd}^2} \quad [\text{A/mm}] \qquad \text{Eqn. (2)}$$

Some variables in equations Eqn. (1) and Eqn. (2) were earlier presented, however, for clarity now, in equations Eqn. (1) and Eqn. (2), $V_{di}$ is the voltage difference across the gated channel 106. $V_{ds}$ is the voltage difference across gated channel 106 and the drift region 307, respectively; $t_{drift}$ is the drift region 307 thickness, $L_g$ and $L_{gd}$ are the gated channel 106 length and the gate-to-drain separation distance (i.e. the length of the drift region 307), respectively; $\varepsilon_s$ is the dielectric permittivity of the channel (e.g. of diamond); $v_s$ is the saturation velocity of the charge carriers (e.g. holes) in for example, diamond; $\mu_h$ is the effective channel mobility under the gate structure 104, and $V_t$ is a threshold voltage of the device. The drift region transport is modeled in bulk. Hence, bulk mobility can be used for $\mu_h$, though bulk mobility is typically higher than the effective channel mobility. As long as the drift region 307 can support enough conduction, the series resistance introduced by the drift region 307 is much smaller than the resistance introduced by the gated channel region 106. The device conduction is therefore, determined by the conduction of the gated channel region 106 under the model detailed by Eqn. (1).

If the gate structure 104 voltage is positively biased, a channel depletion region is induced. At increased gate voltages, the channel depletion region can be widened such that gated channel 106 is pinched off. Under this circumstance, the transistor device is "off" and its breakdown voltage can be mainly determined by the gate-to-drain separation distance $L_{gd}$, which can also be the length of the drift region 307. The breakdown field in diamond is expected to be 10 MV/cm. Hence, with $L_{gd}$ on the order of 100 nm, it is possible for the transistor to support a breakdown voltage of 100V. This high breakdown field allows for the use of a much shorter $L_{gd}$, which is critical to support a sufficient conduction through the drift region 307 of the transistor. The width of the depletion region is determined by the composition of the gate structure 104 (e.g. type of metal and/or conductive material), the gate dielectric layer 109, and the boron doping concentration of channel 103 through the following equation:

$$V_g = V_{fb} + \frac{qN_a W_{dep}^2}{2\varepsilon_s} + \frac{qN_a W_{dep}}{C_{ox}} \qquad \text{Eqn. (3)}$$

where $V_g$ is the gate 104 bias voltage, $V_{fb}$ is the flat-band voltage determined by the composition of the gate 104 (metal) and diamond work function, q is the single electron charge, $N_a$ is the acceptor concentration in channel 103, $\varepsilon_s$ is the dielectric constant of diamond, $C_{ox}$ is the oxide capacitance, and $W_{dep}$ is the width of the depletion region. The second term on the right hand side of Eqn. (3) represents the potential drop across the depletion region and the third term on the right hand side of Eqn. (3) represents the potential drop across the gate dielectric layer. Typically, increasing the dopant concentration of channel 103 increases the gate 104 bias voltage required to generate the same depletion region width. To pinch off the gated channel 106 at a zero gate bias voltage, the depletion region width needs to be larger than half the width of the semi conductive fin channel 107. With an aluminum gate structure 104 and a boron dopant concentration of $5\times10^{16}$ cm$^{-3}$ in diamond, the flat-band voltage, $V_{fb}$, is calculated to be −2.4V using 1.3 eV and 4.08 eV electron affinity for diamond and aluminum, respectively. Using a 45 nm layer of silicon dioxide (SiO$_2$) as the gate dielectric 109, the depletion region width is calculated to be about 55 nm at a zero gate bias voltage. Hence, the device may be designed with 100 nm-wide fins to ensure a current pinch-off at a zero gate bias voltage in at least one embodiment, though the width of fin channel 107 can be less than 500 nm in other embodiments.

Figure 2B:
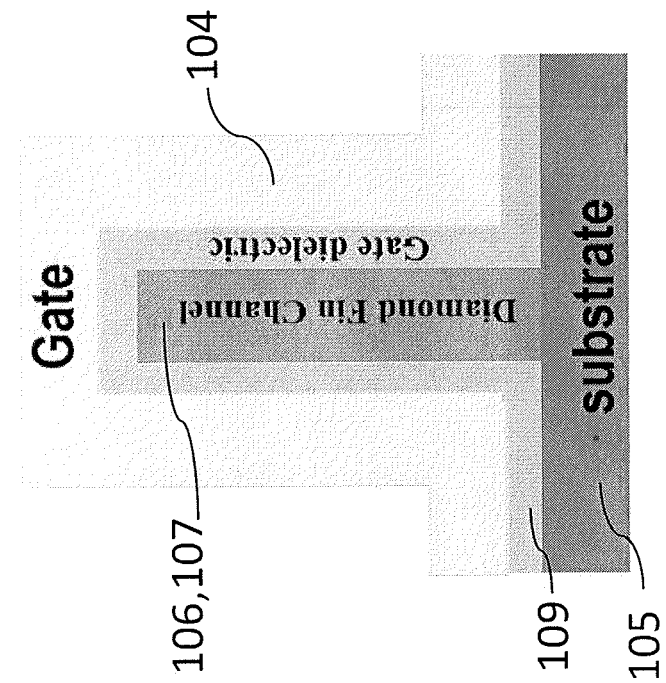
Figure 2A:
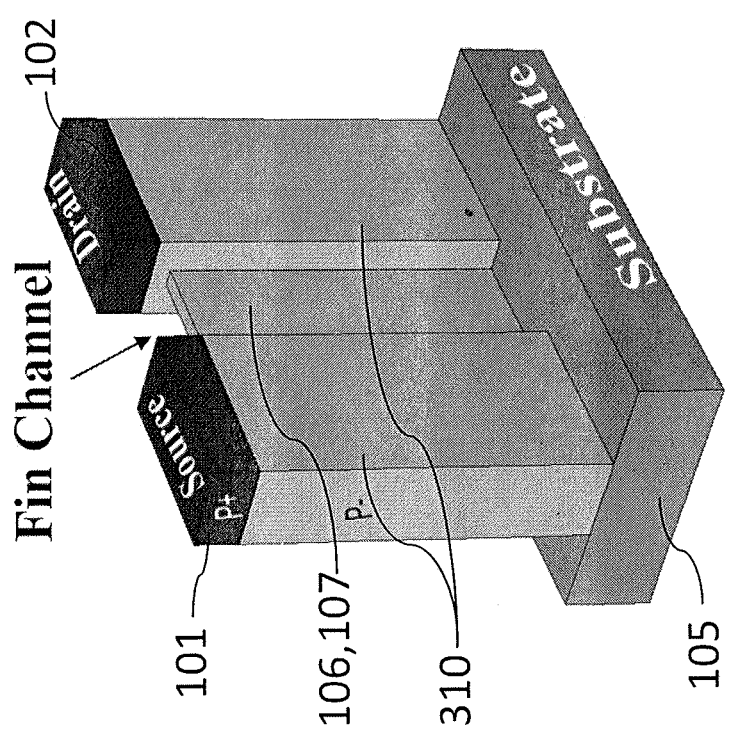

Turning now to FIGS. 2A through 2F and as a brief review of the structure of these figures, FIG. 2A is a schematic drawing of a diamond FinFET showing the source 101, drain 102, gated channel 106, and fin channel 107. Gate 104 and dielectric layer 109 are omitted from this view to focus on the fin channel 107. Heavily doped P-type diamond (P+) is used in the source 101 and drain 102, while lightly doped P-type diamond is used in the fin channel 107. Gated channel 106 can be defined as the portion of channel 103 underneath gate structure 104. In the case that the gate overlaps with source 101 and drain 102, channel 103 is gated channel 106. In the case that gated channel 106 is a purely fin-like structure, gated channel 106 is fin channel 107. However, gated channel 106 should at least comprise fin channel 107 so that the portion of channel 103 underneath the gate comprises fin 107. As such, lead lines originating from gated channel 106 and fin 107 in FIGS. 2A-2F are labeled as "106, 107", indicating that gated channel 106 is fin channel 107. A fin-like structure or channel can include a nanowire structure. For example, gated channel 106/fin channel 107 can have a rounded and/or circular cross section wherein gated channel 106/fin channel 107 has a diameter smaller than 500 nm. Gate structure 104 sufficiently wraps around the nanowire structure of gated channel 106/fin channel 107 to ensure a current pinch off at positive gate voltages.

FIG. 2B is a cross sectional view of the fin channel 107 of the device which is in this figure, shown with the gate dielectric 109 and the gate 104 wrapping around the fin channel 107 on its top and two opposing sides. In a preferred embodiment, the aspect ratio of fin 107 is at least 3:1 (height:width).

Figures 2C, 2D:
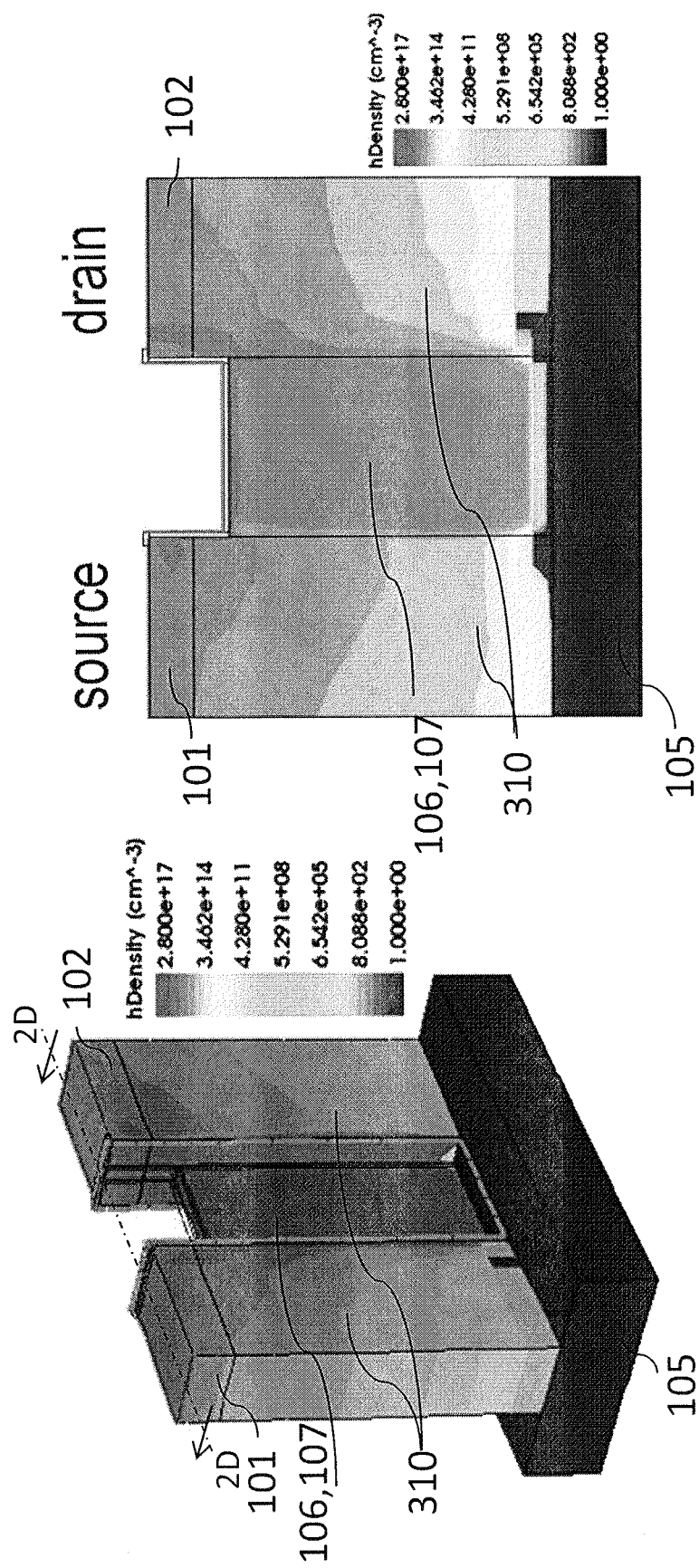

In FIGS. 2C and 2D, the hole concentration is shown when the device is turned "on" by a negative gate bias. FIG. 2D is a cross sectional view of FIG. 2C along the cross sectional line 2D-2D shown in FIG. 2C.

In FIGS. 2E and 2F, the hole concentration of the device is again is shown with FIG. 2E being a perspective view as FIG. 2C is and FIG. 2F being a cross sectional view of FIG. 2E along lines 2F-2F.

In FIGS. 2E and 2F, the device is off with zero gate bias, indicating a completely pinched-off channel.

Going into more detail with respect to FIGS. 2A through 2F, a diamond FinFET is shown. In FIG. 2A two heavily boron-doped diamond layers (P+) as source 101 and drain 102 sitting atop a lightly boron doped diamond layer (P−) as buffer layer 310 are seen. A narrow fin structure 107 is created between the source 101 and drain 102 regions as a conduction channel. The gate 104 and gate dielectric 109 are not shown in this figure as earlier mentioned. The device is built upon a semi-insulating diamond substrate 105, which is used to reduce current leakage. With negative gate bias, the diamond valence band is lifted relative to the grounded source so that the holes form an accumulation layer originating from the source 101, extending through the fin channel 107, to drain 102. Consequently, the device is turned "on". The device current density is essentially determined by the hole concentration and the hole saturation velocity for short-channel devices. Positive gate bias, on the other hand, will induce depletion regions in the channel. Returning to Eqn. (3) above, the depletion region's width is determined by the gate metal, the gate dielectric, and the boron doping concentration of the channel through equation Eqn. (3).

A three-dimensional technology computer-aided design (TCAD) simulation using the software suite Sentaurus™ was executed for a representative device as shown in FIGS. 2A through 2F, with $10^{19}$ cm$^{-3}$ and $5 \times 10^{16}$ cm$^{-3}$ boron dopant concentrations in P+(heavily doped P-type) and P−(lightly doped P-type) regions, respectively.

In FIGS. 2A through 2F, the device channel 106 width was set to be 100 nm with the gate 104 structure being composed of aluminum (Al) and the gate dielectric 109 comprising 45 nm silicon dioxide ($SiO_2$). FIG. 2C illustrates the simulated hole concentration in three dimensions, with the source 101, drain 102, and gate 104 biased at the voltages 0V, −16V, and −10V, respectively. As earlier noted, FIGS. 2D and 2F are cross sectional views taken along lines 2D-2D of FIGS. 2C and 2F-2F of FIG. 2E, respectively. Under a negative gate bias voltage, the fin channel 107 is populated with holes as shown in FIG. 2D; hence the device is turned "on", as can be seen by the lightly shaded regions of fin channel 107. A gradient of increasing hole concentrations extends from substrate 105 and upward through each of the buffer layers 310 underneath the drain 102 and source 101, with fin channel 107 and source/drain region 101 and 102 having the highest concentration of holes ($>2.8 \times 10^{17}$ cm$^{-3}$) and regions of buffer layer 310 adjacent substrate 105 having a low concentration of holes ($<1 \times 10^{15}$ cm$^{-3}$). Substrate 105, being either N-type diamond or intrinsic diamond, has a hole concentration of zero. The amount of charge accumulated is determined by the gate bias voltage and the gate-to-channel capacitance. Similarly, FIGS. 2D and 2E illustrate the distribution of holes under a 0V gate bias voltage and a −16V drain bias voltage. The fin channel 107 is completely depleted as expected, from a calculation using a simple one-dimensional electrostatic model, as can be seen by the dark shaded regions of fin channel 107, wherein fin channel 107 and substrate 105 have a low hole concentration of about $<1.0 \times 10^5$ cm$^{-3}$. It is noted that there is a depletion region extending into the drain region 102. This is because the negative drain bias voltage relative to the zero gate bias voltage pulls holes away from the drain/channel region even though the drain is doped at a high concentration of $10^{19}$ cm$^{-3}$, the drain region still being non-degenerated.

As can be appreciated from the foregoing, one feature of the present technology is that the transistor incorporates a fin structure configured to enable the device to operate with both a high breakdown voltage and a high "on" current. In order to support a high "on" current, the drift region 307 needs to be sufficiently conductive. To increase the drift region 307 conduction, one technique comprises reducing the drift region length, $L_{gd}$. In equation Eqn. (2) above, the drift region 307 current is inversely proportional to $L_{gd}^2$, the square of the distance between the gate 104 and the drain 102. However, the minimum gate-to-drain distance, $L_{gd}$, is limited by the desired device breakdown voltage as reducing $L_{gd}$ also reduces the device's breakdown voltage.

Another method to increase the drift region conduction comprises increasing a thickness of the drift region to include more bulk space, at the expense of limiting the gate-to-channel control. For example, in a traditional top gate only device (i.e. a device having a top gate such as a planar MOSFET), the conduction channel will be incapable of being pinched off when the drift region thickness is sufficiently large. The drift region thickness is measured along an axis perpendicular to the substrate, and running from the bottom of the drain 102 to an uppermost surface of the drift region. Incorporating a fin structure facilitates the wrapping of the gate structure 104 around the channel, wherein, in addition to the top gate, the side gates (those gates which cover the side faces of the fin/channel) can pinch off the gated channel 106 when the width of the channel 106 and fin 107 is sufficiently small, thin, or fin-like. This essentially decouples (or reduces the coupling of) the drift region 307 thickness from the gate-to-channel control, offering the freedom to increase the drift region 307 conduction by increasing the thickness of the drift region 307 without sacrificing the gate-to-channel control.

A similar description can be made for the drift region width. That is, the method of increasing the drift region conduction can comprise increasing the drift region width. Incorporating a fin structure still has the benefit of decoupling (or reducing the coupling of) the drift region 307 width from the gate-to-channel control since gate structure 104 can pinch off gated channel 106 when the width of channel 106 and fin 107 is sufficiently small, thin, or fin-like. In a preferred embodiment, the width of drift region 307 is larger than the width of the channel 106 and/or fin 107.

A second feature of the transistor having a fin structure with a buffer layer 310, as shown, includes the capability of blocking or reducing substrate punch-through effects. If the device length is sufficiently short, the source 101 and drain 102 regions can leak current through the substrate when the device is "off," as shown with the white arrow 333 in FIG. 1E. The "X" positioned over the white arrow 333, as noted above, indicates that the current leaked through the substrate is blocked or reduced upon the incorporation of buffer layer 310. The P-N junction formed between source/drain (101, 102) and substrate 105 can still be punched through under a high voltage operation of the drain 102. To mitigate these effects and as earlier noted, a buffer layer 310 can be incorporated into the transistor device to separate each of the source 101 and drain 102 regions from the substrate 105. This optional buffer layer 310 essentially increases the leakage path between the source/drain (101, 102) and through the substrate 105. Hence, increasing a thickness of the buffer layer 310 increases the leakage path between the source 101/drain 102 and the substrate, thereby increasing the significance, or weight, of the gate-to-drain separation, $L_{gd}$, in determining the breakdown voltage of the device. The gate-to-drain separation, $L_{gd}$, can therefore determine the device breakdown voltage when the buffer layer 310 is sufficiently thick.

Figure 2G:
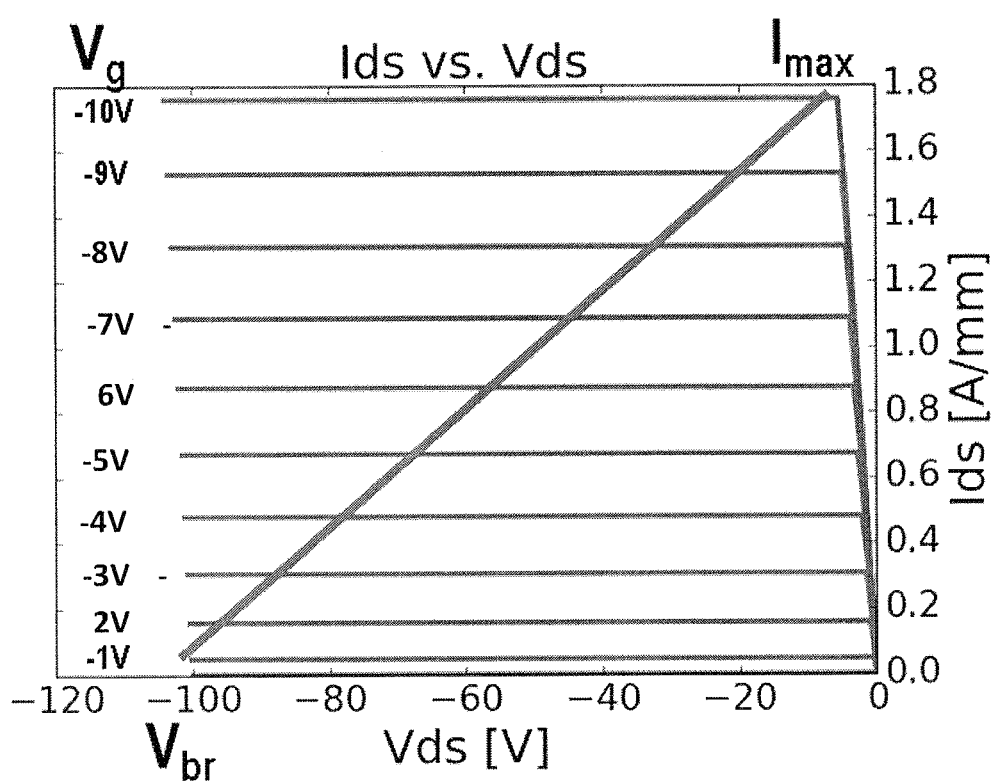
FIG. 2G illustrates a graphical representation of a simulated drain current of a transistor plotted against voltage differences between source and drain at different gate voltages, of an embodiment of the technology herein presented.

If the gated channel 106 length is sufficiently long, and/or the dopant concentration in the drift region 307 is sufficiently high, the drain voltage has a minor or negligible effect on the source/channel barrier and the device conduction can be modeled as two resistors in series, wherein the gated channel 106 is coupled in series to the drift region 307. Based on this model, the transistor device drain current, $I_{DS}$, is simulated as shown in FIG. 2G for a device having a gated channel 106 length of 100 nm and a drift region 307 length of 100 nm. Here, $V_{DS}$ is the voltage difference between drain and source, and $V_g$ is the voltage difference between the gate and source. The height of the fin in gated channel 106 is 400 nm. The total current is adjusted by an area filling factor of four to reflect the current density in a fin array. The short channel effect in the gated channel 106 region is also considered in the simulated model. A positively sloped load line is illustrated in FIG. 2G to indicate the potential device operation with maximum current and breakdown voltage. The simulation in FIG. 2G considers the simple one-dimensional model, though a more detailed two-dimensional simulation using Technology Computer Aided Design (TCAD) software can be implemented. For a short channel device wherein the total device length is sufficiently short, the effect of the drain 102 bias voltage on the source/channel barrier height can be significant.

Figure 2H:
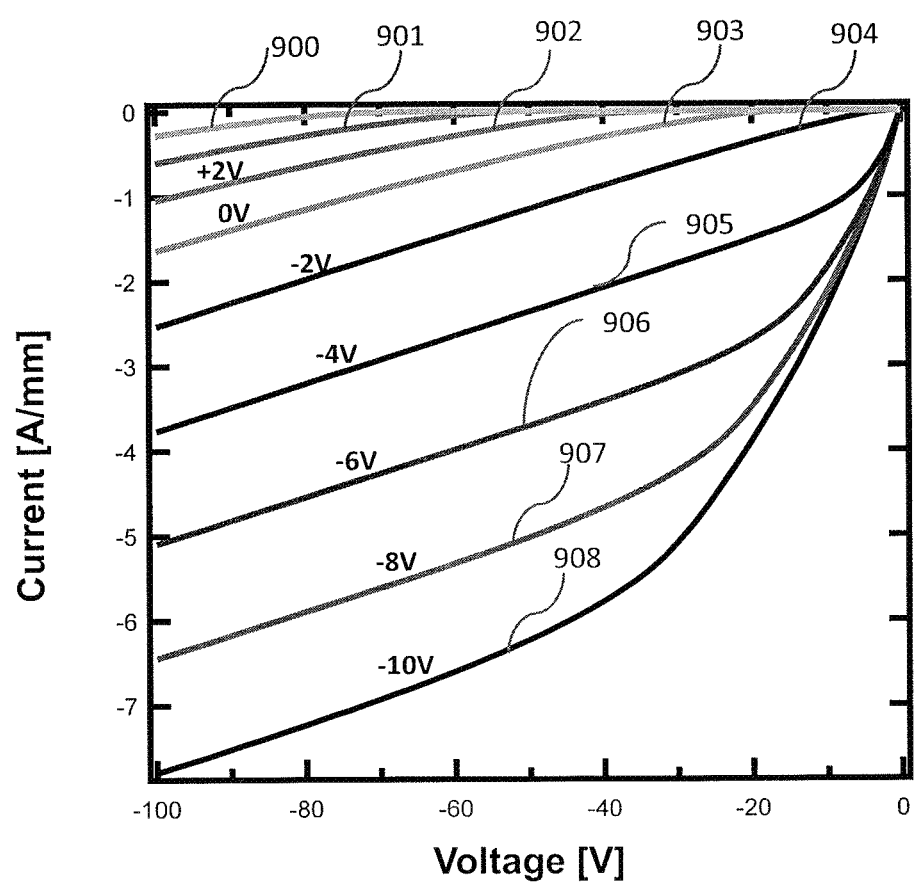
FIG. 2H illustrates a graphical representation of a simulated drain current plotted against drain voltage, for gate voltages ranging from +6V to −10V, of an embodiment herein presented.
Figure 2A:
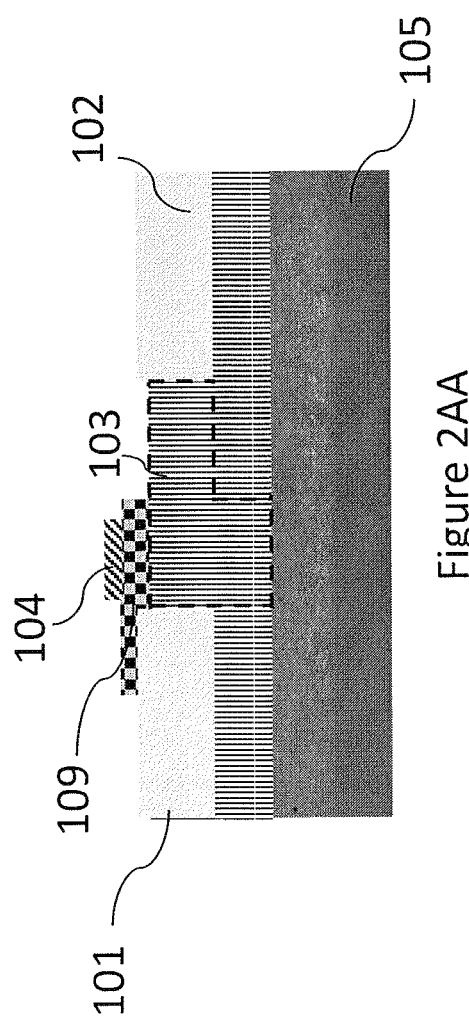
Figure 2B:
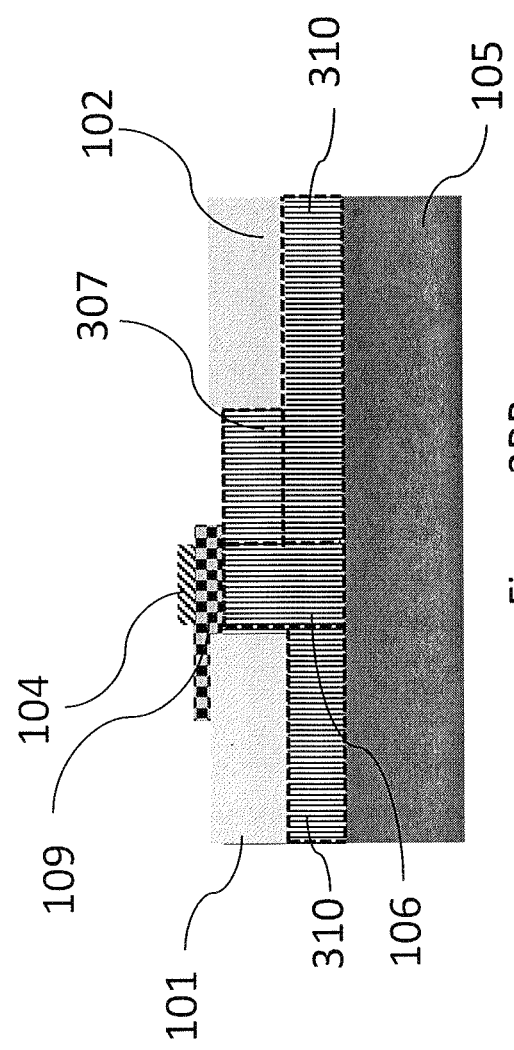

In practice, the device behavior can deviate from the simulation shown in FIG. 2G and can be closer to the behavior of a SIT device, the three-dimensional simulation of which is shown in FIG. 2H. FIG. 2H illustrates a graphical representation of a three dimensional simulation of an operation of the device, with drain currents plotted against drain bias voltages, for gate voltages ranging from −10V to +6V with incremental steps of 2V. Gate and drain voltages are measured with respect to a grounded source. Curves 900, 901, 902, 903, 904, 905, 906, 907, and 908 correspond to gate bias voltages +6V, +4V, +2V, 0V, −2V, −4V, −6V, −8V, and −10V, respectively, indicating that the magnitude of the drain current decreases as the gate bias voltage increases.

To illustrate the behavior of the device, a prototype device featuring a 2×3 finger FinFET with titanium (Ti)/platinum (Pt)/gold (Au) multiple layer ohmic contacts to the P+ regions was fabricated and its electronic properties were measured. Though platinum and gold layers were used to form the ohmic contacts, the titanium layer is the most essential layer of the above three layers since titanium carbide can form upon deposition and annealing of titanium on the P+ regions. However, an ohmic contact made of only platinum is contemplated. Any metal that can be used to form a carbide upon its deposition and following thermal annealing on diamond, such as for example, tungsten (W), can be used as an ohmic contact. Ohmic contacts to the P-+ regions (the source and drain regions) should be made of the same material. For this, we refer the reader to FIGS. 6A and 6B which are scanning electron microscope (SEM) images of a transistor according to the technology described herein, with the source 401, drain 402, and gate 404 regions labeled with "S", "D", and "G", respectively. Here, the source 401 and drain 402 each comprise a metal contact coupled to a heavily doped P-type region of the prototype. The width of the fin channel 406 was designed to be 100 nm and the height of the fin channel, which is determined by the thickness of the P− layer, was designed to be 2 μm, resulting in an aspect ratio of about 20:1 for the height and width of the fin channel. Here, the terms "height" and "width" refer to distances measured along the z-axis and y-axis of FIG. 6B, respectively. The fin 406 channel is connected to the lightly doped P− region underneath the heavily doped P+ ohmic layer. The length of the P− channel was designed to be about 800 nm for this prototype. However, due to the sidewall slope of the channel resulting from the process of dry etching, the channel length is reduced significantly at the bottom of the fin 406 after etching through the 2 μm P-type film. A 45 nm atomic layer deposition of silicon dioxide ($SiO_2$) was used to form the gate dielectric and aluminum was used to form the gate structure 104.

Figure 6C:
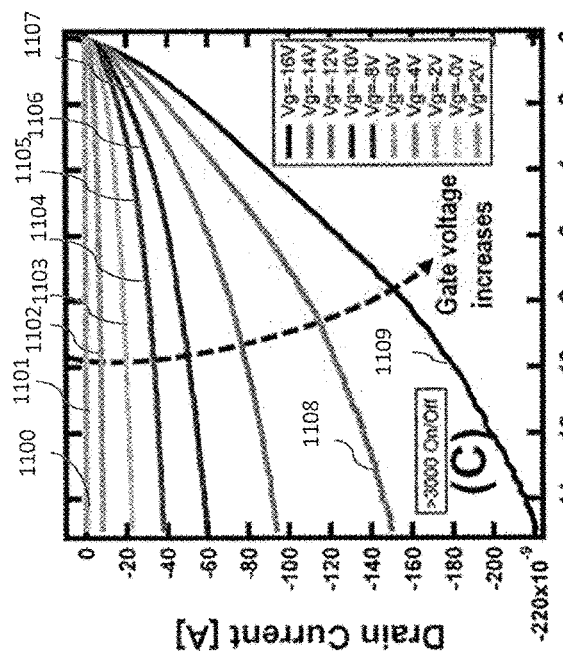
FIG. 6C illustrates a graphical representation of a measured drain current plotted against drain voltage, for gate voltages ranging from +2V to −16V, according to a prototype of an embodiment herein presented.
Figure 6D:
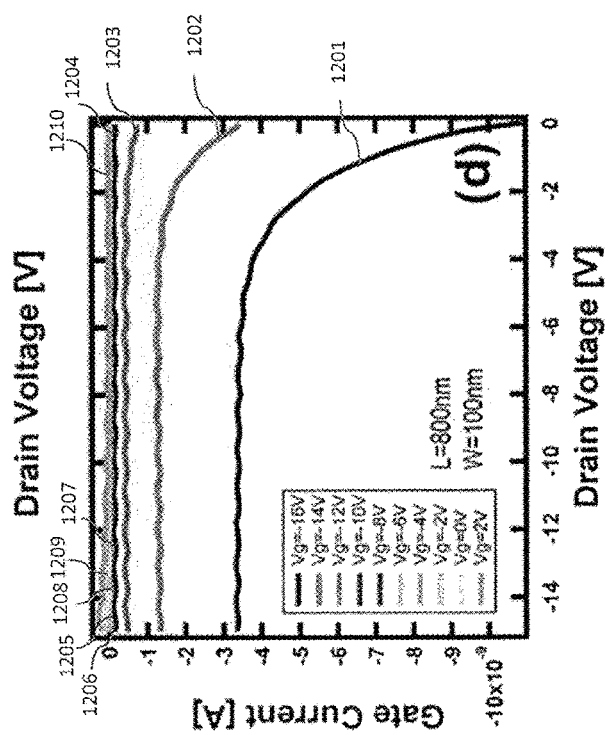
FIG. 6D illustrates a graphical representation of a measured device gate current plotted against drain voltage, for gate voltages ranging from +2V to −16V, according to a prototype of an embodiment herein presented.

FIG. 6C illustrates a graphical representation of the drain current as a function of the drain bias voltage at different gate bias voltages for the prototype diamond transistor illustrated in FIGS. 6A and 6B. Drain and gate voltages are measured with respect to a grounded source. Curves 1100, 1101, 1102, 1103, 1104, 1105, 1106, 1107, 1108, and 1109 correspond to gate 104 bias voltages +2V, 0V, −2V, −4V, −6V, −8V, −10V, −12V, −14V, and −16V, respectively. The DC transfer characteristics of the device in FIG. 6A was measured for the left source, drain, and gate; the right source terminal was floated and not electrically coupled for measurement. The prototype includes a gate-to-drain overlap and the breakdown voltage is limited by the properties of the gate dielectric. The amount of overlap present in the prototype depends upon the processing technique utilized. As expected at a zero or positive gate bias voltage (i.e., 0V or 2V), the gated channel 406 is completely pinched off; hence, no channel current is observed in FIG. 6C at these voltages. With the increase of a negative gate bias voltage, the channel becomes increasingly conductive, as shown in FIG. 6C. At a small negative drain bias voltage, the channel current is linearly proportional to the drain bias voltage, though it becomes saturated at a more negative drain bias voltage. The maximum drain current observed was 0.22 μA, resulting in an on/off current ratio larger than 3000:1. The gate leakage is shown in FIG. 6D. Curves 1201, 1202, 1203, 1204, 1205, 1206, 1207, 1208, 1209, and 1210 correspond to gate 104 bias voltages −16V, −14V, −12V, −10V, −8V, −6V, −4V, −2V, 0V, and +2V, respectively. Gate and drain voltages are again measured with respect to a grounded source. Only about a −10-nA gate current leakage was observed at large gate-to-drain potential differences. The maximum current of each fin channel was about 70 nA, which translates into a current density of 0.7 mA/mm, assuming a fin channel width of 100 nm. Note that the current density here is calculated by dividing the maximum current by the width of the fin channel instead of its cross-sectional area. These transfer characteristics clearly demonstrate the concept of diamond FinFET. The breakdown voltage of the current device is larger in magnitude than that of the applied maximum gate voltage, |−15V|. Since the gate and drain overlap, the maximum breakdown voltage is essentially determined by the gate dielectric thickness and dielectric breakdown field. A dielectric thickness of 45 nm would support a breakdown voltage of 45V, assuming a breakdown field of 10-MV/cm. To increase the breakdown voltage of the device, the gate-to-drain distance, $L_{gd}$, can be optimized to increase and/or maximize the power performance of the device at a desired frequency.

Figures 7A, 7B, 7C:
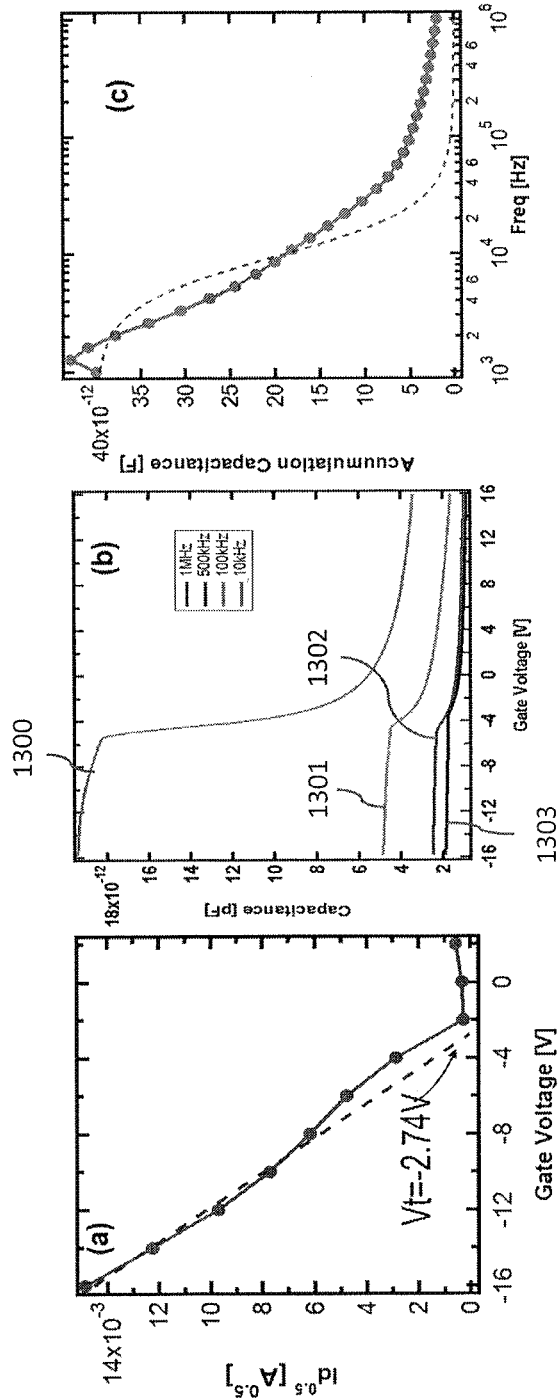
FIGS. 7A through 7C present varying gate voltage and frequency graphs.

Turning to FIG. 7A, a graphical representation is shown plotting the square root of the drain current $\sqrt{I_d}$, against the gate voltage for the extraction of the gate threshold voltage, wherein the gate voltages are measured with respect to a grounded source. In FIG. 7A, the drain current is taken at the saturation region. The exploration indicates a threshold voltage exists at −2.74 V. In FIG. 7B, capacitance is plotted against the gate voltage at different frequencies for a MOS capacitor fabricated on the same chip. Curves 1300, 1301, 1302, and 1303 correspond to frequencies 10 kHz, 100 kHz, 500 kHz, and 1 MHz, respectively. In FIG. 7C, a graphical representation is shown plotting the maximum accumulation capacitance against the frequency to illustrate the frequency dependence of the maximum accumulation capacitance. The dotted line is the calculated capacitance based upon a model with a serial resistor.

Figures 8A, 8B:
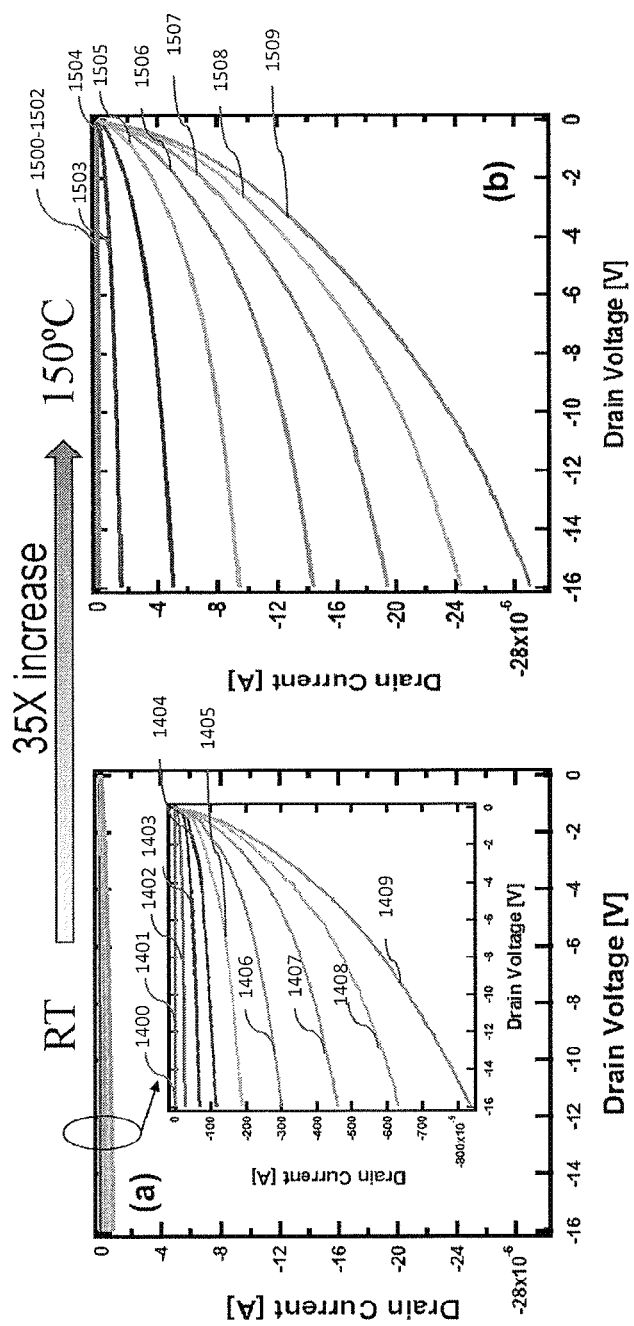
FIGS. 8A and 8B present the transfer characteristics of a diamond FinFet at room temperature and at an increased temperature, respectively, wherein drain currents are plotted against drain voltages for gate voltages ranging from −16V to +2V.

The device threshold voltage can be determined by the linear extrapolation method in the saturation region to avoid the impact of series resistance. As shown in FIG. 7A, the gate threshold voltage was measured to be about −2.74V, which is close to the flat-band voltage calculated by band alignment. This is consistent with capacitance vs. gate voltage (CV) measurements on MOS capacitors fabricated on the same chip, as shown in FIG. 7B. The diamond substrate was grounded, hence at large negative gate biases, holes formed an accumulation layer, showing maximum capacitances. However, the measurement of maximum capacitance in the accumulation regime for different frequencies ranging from 1 kHz to 1 MHz, as shown in FIG. 7C, clearly indicates the impact of series resistance: with increased measuring frequency, maximum accumulation capacitance decreases. Even at a frequency of 10 kHz as shown in FIG. 7B maximum capacitance only reaches 19 pF for a 50050-$\mu m^2$ MOS capacitor, which is about half of the theoretical value (38 pF) based upon the $SiO_2$ thickness. Only at very low frequencies could the theoretical value be reached due to much less impact of the series resistance. This is consistent with other frequency-dependent studies for diamond MOS capacitors. Taking the series resistance into account, the maximum accumulation capacitance at various frequencies can be calculated as shown in FIG. 7C. The model and measured data show good agreement of the general trend of frequency dependency. The disagreement might originate from the interface charge on non-ideal diamond/dielectric interface. The ohmic contacts in the device are formed on diamond nominally doped with boron at a concentration of $10^{19}$ cm$^{-3}$. Although the doping in contact regions is much higher than that in the channel, it is still a much less than typical 2-5×$10^{20}$ cm$^{-3}$ doping concentration needed for a metal-to-insulator transition in diamond. Due to incomplete ionization, only less than 0.1% of boron is activated at room temperature, leading to much larger contact resistance. This explains the frequency dependency in MOS CV measurement. To further understand this and explore the device's capability, a similar diamond FinFET was measured at a higher temperature. FIGS. 8A and 8B show the measured IV (current voltage) at room temperature and 150° C. respectively. They were drawn in the same scale. In FIG. 8A, the inset is the room temperature data redrawn in a different scale to show the transfer characteristics.

Turning again to FIG. 8A, the drain current is plotted against the gate bias voltage for a device held at room temperature. Curves 1400, 1401, 1402, 1403, 1404, 1405, 1406, 1407, 1408, and 1409 correspond to gate bias voltages 2V, 0V, −2V, −4V, −6V, −8V, −10V, −12V, −14V, and −16V. At room temperature, the maximum drain current is about 838 nA for a −16V bias voltage on the gate and drain. By operating the device at an elevated temperature of 150° C., the current is increased by a factor of 35, to about 29 μA with the same bias voltage, as shown in FIG. 8B. Curves 1500, 1501, 1502, 1503, 1504, 1505, 1506, 1507, 1508, and 1509 correspond to gate bias voltages 2V, 0V, −2V, −4V, −6V, −8V, −10V, −12V, −14V, and −16V. For a $10^{19}$ cm$^{-3}$ boron doping concentration, the boron activation efficiency was calculated to be 5×$10^{-4}$ at room temperature. At 150° C., the boron activation efficiency increased to about 5×$10^{-3}$. This is consistent with the conduction current increase as shown in FIG. 8B indicating the limitation of ohmic contact in current devices. Through a transmission line measurement (TLM), the ohmic contact resistances at room temperature and 150° C. were extracted to be 493 Ω·mm and 47 Ω·mm, respectively. This is also consistent with the observed current increase in the transistor measurement. In conclusion, a diamond FinFET with more than 3000 on/off ratio was demonstrated. The thresh-, old voltage and MOS capacitance measurements show a hole accumulation in the device. The 30 mA/mm maximum current density was observed at 150° C. The relatively low current density was mainly limited by a high ohmic contact resistance due to the incomplete ionization of boron. A high ohmic contact resistance can be defined as an ohmic contact resistance above 10 Ω·mm. The observation of a higher conductivity at elevated temperatures indicates the potential of diamond FinFETs for high-temperature environments. A high temperature environment can be defined as an environment with a temperature greater than or equal to 100° C. Or it can be defined as any temperature above room temperature as that temperature is understood by those skilled in the art. It is reasonable to expect that the contact resistance can be improved significantly by increasing the boron dopant concentration because higher boron doping levels in diamond has been demonstrated to improve the ohmic contact resistance for superconducting applications. For practical applications in power or radio frequency (RF) electronics, diamond transistors need to provide at least 1 A/mm current density to be competitive. The cutoff frequency of a diamond FinFET also needs to reach 100 GHz to be useful for RF applications at the Ka frequency band (the Ka band is a portion of the microwave part of the electromagnetic spectrum defined as frequencies in the range 26.5-40 gigahertz (GHz) i.e. wavelengths from slightly over one centimeter down to 7.5 millimeters).

There are challenges to improving the device performance through ohmic, gate dielectric engineering. However, this new diamond transistor device design, leveraging the existing technologies, represents a paradigm shift for future diamond research ranging from digital to RF electronics.

The remaining figures present the transistor above discussed in a more simplified review and may be helpful to the reader in better understanding the foregoing presentation.

Turning to FIGS. 2AA through 2BB, there is seen a variation of the cross sectional shown in FIG. 1C, Again, present are source 101, drain 102, semi conductive channel 103, substrate 105, and gate structure 104. These are all evident in FIG. 2AA.

FIG. 2BB is identical to FIG. 2AA except that it identifies gated channel 106, buffer layer 310, and drift region 307. Semi conductive channel 103, which is shown in FIG. 1B, comprises gated channel 106 and drift region 307 shown in FIG. 2BB. FIG. 2BB introduces the optional buffer layer 310. Buffer layer 310 can reduce current leakage through the substrate when the device is, for example, turned "off". In a preferred embodiment, buffer layer 310, gated channel 106, and drift region 307 are made of lightly doped P-type diamond. In a preferred embodiment, buffer layer 310, gated channel 106, and drift region 307 are integrally made of lightly doped P-type diamond.

As seen in a number of the drawings, source 101 and drain 102 regions are supported by substrate 105. In some embodiments, source 101 and drain 102 regions can be separated from substrate 105 by a buffer layer 310. Buffer layer 310 provides additional voltage blocking when the transistor is "off". Buffer layer 310 can be removed in certain embodiments, thereby allowing direct contact of the substrate 105 to the source 101 and drain 102 regions. In some embodiments, the thickness of buffer layer 310 between source 101 and substrate 105 is different than the thickness of buffer layer 310 between the drain 102 and substrate 105. In other embodiments, the thickness of buffer layer 310 between source 101 and substrate 105 is the same as the thickness of buffer layer 310 between drain 102 and substrate 105. Increasing the thickness of buffer layer 310 essentially increases the current leakage path distance between source 101 and drain 102, and through the substrate, thereby reducing the current leaked through substrate 105 when for example, the transistor is turned off.

Gate structure 104 is separated from gated channel 106 by a dielectric layer 109, as seen in FIGS. 2AA-2CC. Dielectric layer 109 can also be used to insulate gate structure 104 from source 101. Gate structure 104 can comprise or be composed of metal, alloys, or any suitable conductive material. A portion of channel 103 underneath a surface of the gate structure 104 is seen to define gated channel 106. As can be seen in FIG. 2BB, drift region 307 does not have a surface covered by gate structure 104.

Figure 3A:
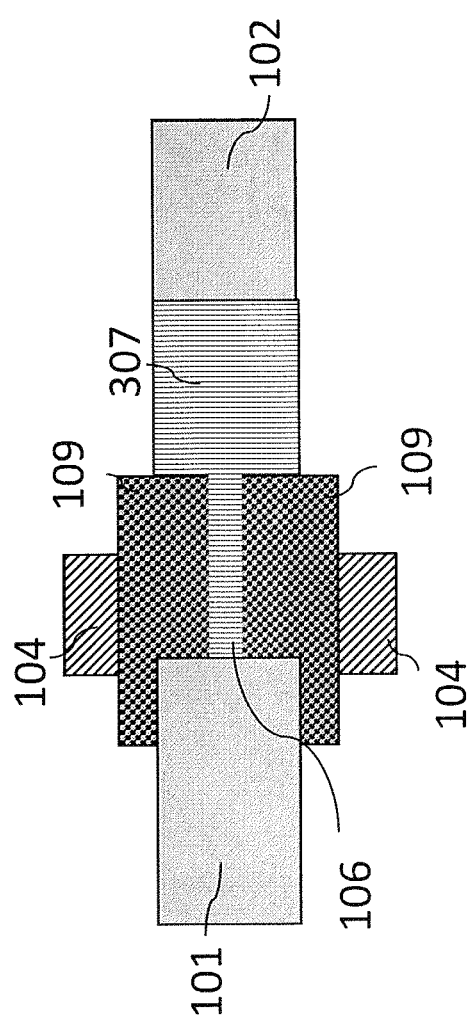
FIG. 3A illustrates a cross sectional view taken along line 3A-3A of FIG. 1B.
Figure 3B:
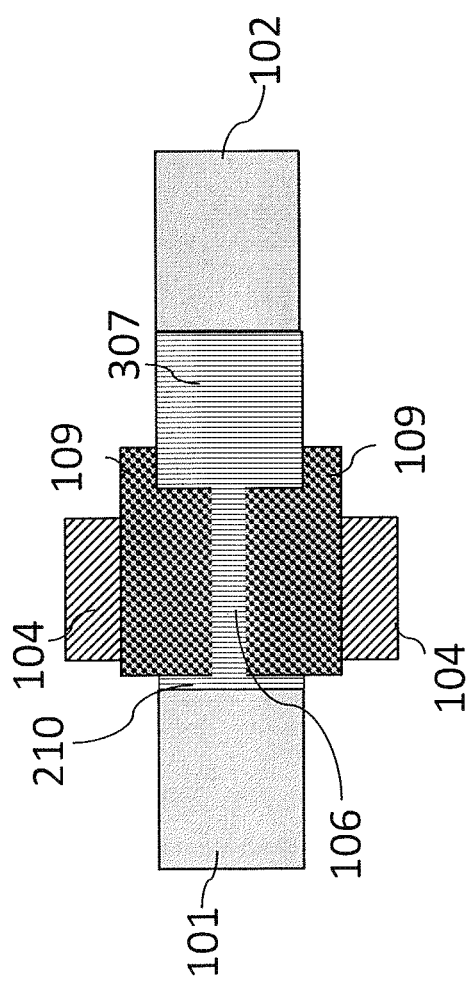
FIG. 3B illustrates a variation from that which is presented by FIG. 3A.

Turning now to FIG. 3A (which is a cross sectional view taken along line 3A-3A of FIG. 1B), source 101 and drain 102 are shown associated with gated channel 106, which lies within channel 103 as shown in FIGS. 2AA-2BB. From FIGS. 2AA and 2BB, FIG. 3A also includes dielectric layer 109 which electrically insulates gate structure 104 from gated channel 106.

In FIG. 3B, which is a variation of FIG. 3A, gate structure 104 no longer overlaps source 101 but is spaced therefrom to form a gap with channel 210 revealed. Channel 210 can be formed integrally with buffer layer 310, gated channel 106, and drift region 307 shown in FIGS. 2AA-2DD, and can be made of lightly doped P-type diamond. Channel 103 identified in FIG. 2AA can comprise channel 210, though this is not illustrated.

Figure 3C:
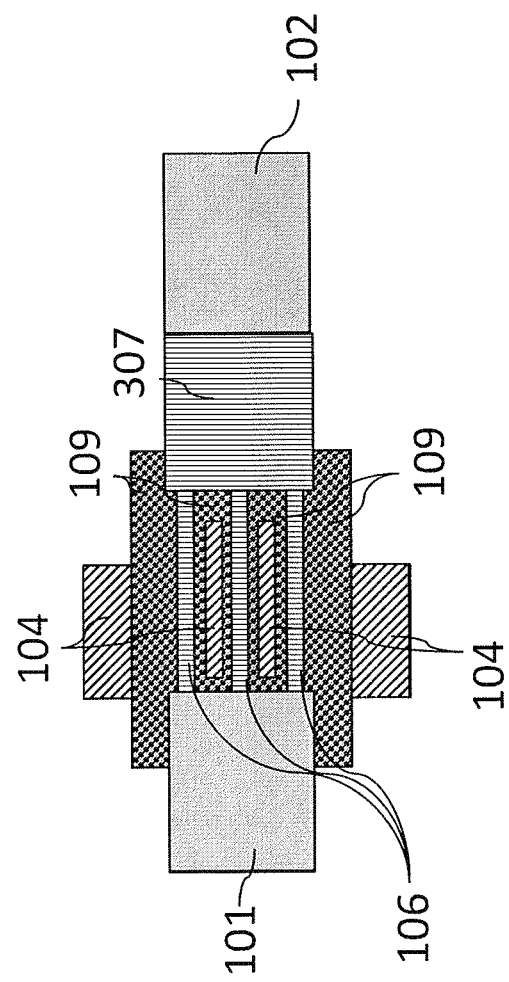
FIG. 3C illustrates a variation from that which is shown in FIG. 3A, and differs from FIG. 3A in that it presents three gated channels rather than one.
Figure 3D:
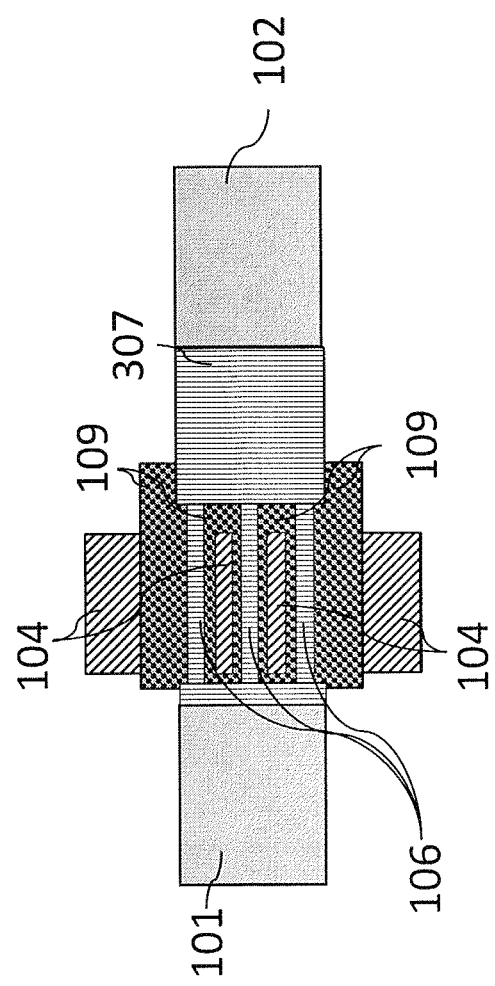
FIG. 3D illustrates a variation from that which is presented by FIG. 3A.

In FIGS. 3C and 3D, which respectively mirror FIGS. 3A and 3B, rather than one gated channel 106, there is shown more than one gated channel. Three gated channels 106 have been chosen for illustration purposes only. In addition, the gate structure 104 wrapped around the three gated channels 106 can comprise several electrically independent gate structures, wherein each electrically independent gate structure wraps around a respective gated channel, though this is not illustrated. The benefit of using more than one gated channel 106 is that the current flowing through the transistor can be increased. The benefit of wrapping each gated channel 106 with its own gate structure is that, essentially, a parallel combination of single gated channel 106 devices is facilitated.

Returning to FIG. 3A, single gated channel 106 is coupled or defined between source 101 and drift region 307, wherein gate structure 104 overlaps source 101. One benefit of the gate structure 104 overlapping source 101 is that the device can operate with a higher maximum current and a reduced device breakdown voltage. Gate structure 104 overlapping source 101 is optional. In high frequency devices, this overlap can be nonexistent, such that channel 210 separates the gate structure 104 and the source region 101. This is shown in FIGS. 3B and 3D. If gate structure 104 does not overlap source 101, the device operates with a lower maximum current and an increased breakdown voltage. In FIG. 3B, gate structure 104 does not overlap with source region 101, and a single gated channel 106 is coupled (defined) between drift region 307 and channel 210 within channel 103.

In FIG. 3C, a plurality of gated channels 106 is coupled between source 101 and drift region 307, wherein the gate structure 104 overlaps with source region 101.

In FIG. 3D, gate structure 104 does not overlap source region 101, and the plurality of gated channels 106 is coupled/defined between drift region 307 and channel 210 within channel 103. Gated channel 106 can be separated from the drain region 102 by a drift region 307, which is situated within channel 103.

Figure 4B:
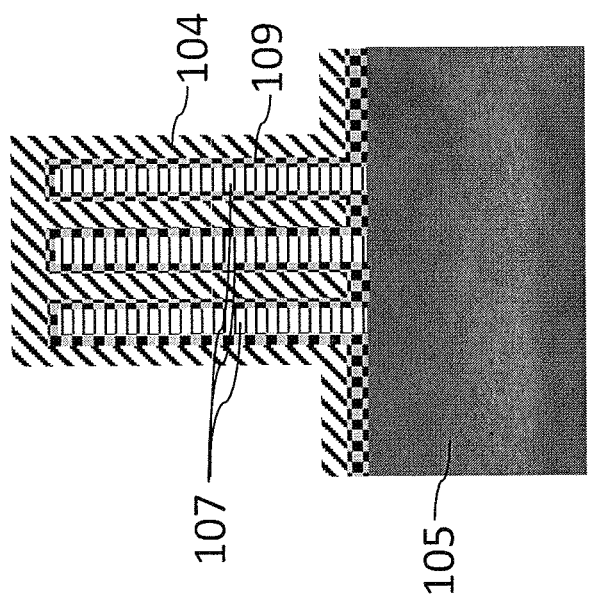
FIG. 4B illustrates a cross sectional view taken along line 4A-4A of FIG. 1B, and differs from FIG. 4A in that it presents three gated channels rather than one.
Figure 4A:
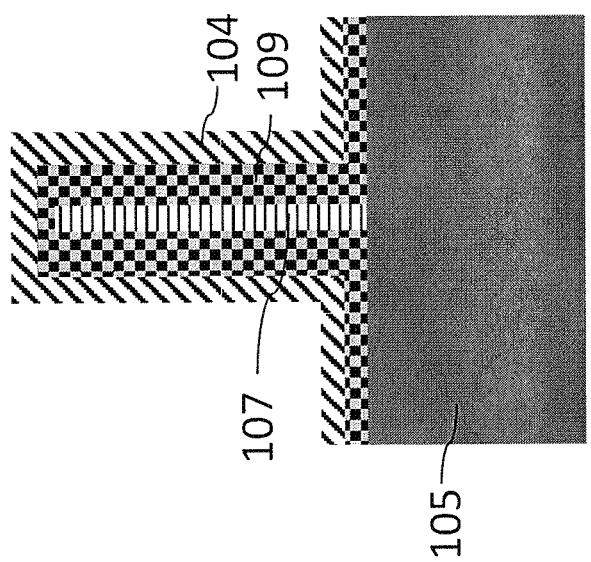
FIG. 4A illustrates a cross sectional view taken along line 4A-4A of FIG. 1B.

Turning to FIG. 4A, a cross sectional view of the transistor, along line 4A-4A of FIG. 1B shares the same reference numerals as found in FIG. 1B and further includes reference numerals 107 and 109 which are respectively, a semi conductive fin and a dielectric layer. The semi conductive fin 107 having a rectangular cross section is formed in a region of the gated channel 106 shown in FIGS. 3A-3D, the fin 107 electrically coupling source 101 and drain 102 regions of the transistor. Gate structure 104 can be formed on one, two, or three faces of fin 107. The one, two, or three faces of fin 107 can comprise the top, side, and/or bottom surfaces of fin 107. Therefore, gate structure 104 can be regarded as a multiple gate structure 104. Gate structure 104 is electrically insulated from fin 107 by dielectric layer 109. More than one gated channel 106 is seen in FIG. 4B which is otherwise the same as FIG. 4A. Gate structure 104 covers one, two, or three faces of each fin 107 in FIG. 4B. From these Figures, it is seen that gate structure 104 covers or surrounds an outermost surface of gated channel(s) 106, wrapping around the top and side faces of gated channel(s) 106.

FIG. 4A illustrates an embodiment of the transistor having one gated channel 106, wherein the gated channel 106 comprises one semi conductive fin 107, Alternatively, the gated channel 106 can comprise a plurality of gated channels 106 as seen in FIG. 4B, wherein each gated channel 106 comprises a semi conductive fin 107 all of which are covered or partially surrounded by gate structure 104. In some embodiments, gated channel 106 is the semi conductive fin 107, though in other embodiments, gated channel 106 comprises the semi conductive fin 107 so that fin 107 extends along a majority of the length of gated channel 106. In all embodiments, dielectric layer 109 insulates gate structure 104 from gated channel 106 and fin 107.

Figures 5C, 5D:
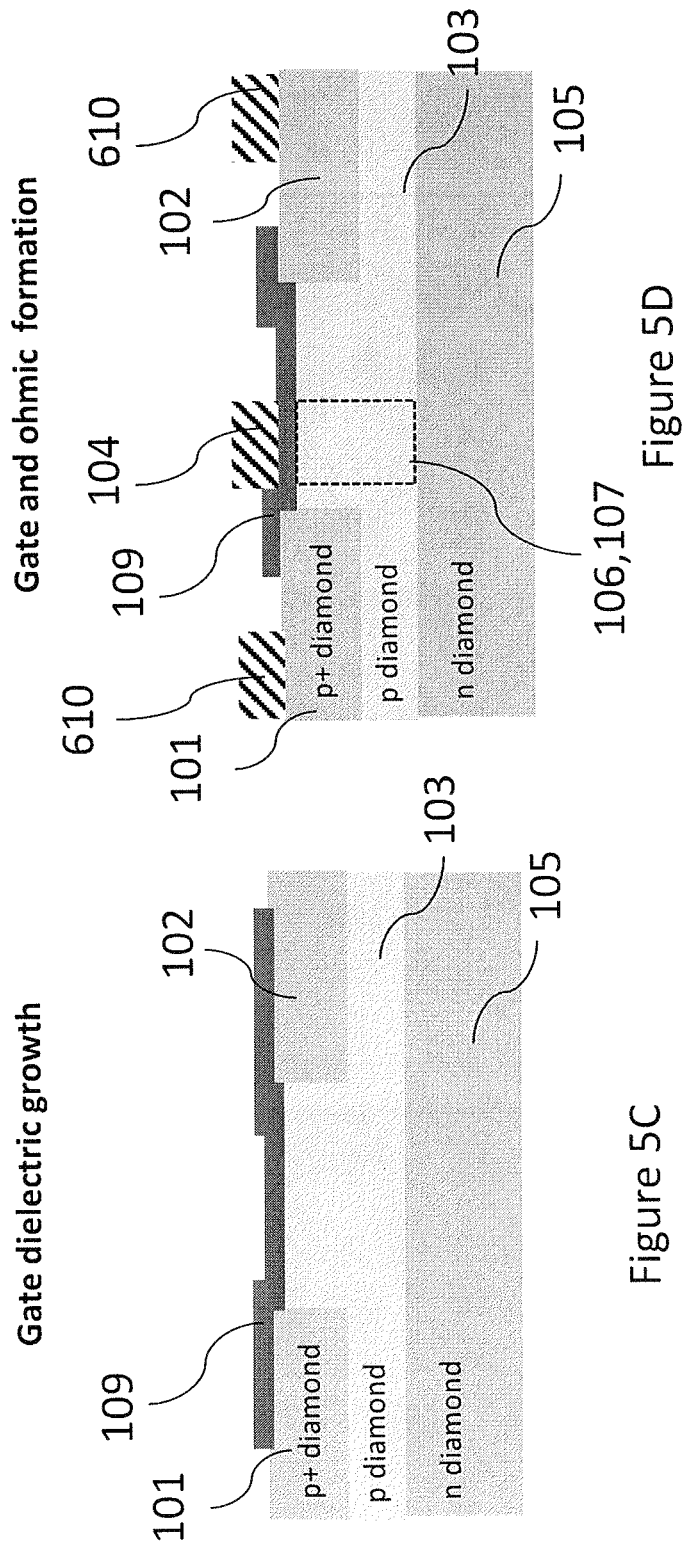

Methodology and fabrication methods for manufacturing a diamond Fin-SIT device can comprise a variety of different methods, as shown in FIGS. 5A-5D. Steps in the fabrication of the transistor comprise: forming good ohmic contacts to the source 101 and drain 102 regions by forming heavily doped P+ diamond regions on a semi conductive channel 103 to create the source 101 and drain 102 regions of the transistor with regrown P+ diamond; dry etching and/or using electron beam lithography on lightly doped P− regions of channel 103 to form a fin channel 107. Regrown P+ diamond is P+ diamond whose growth occurred after the fabrication of the device began. Source 101 and drain 102 regions can be patterned by positioning a mask 609 comprising, for example, silicon dioxide (SiO2) or metal, on a surface of the lightly doped P− diamond region. The patterned sample can be loaded into a diamond growth apparatus, such as, for example, a microwave plasma CVD growth apparatus configured for diamond growth with high boron doping as shown in FIG. 5A. The mask can be removed by either wet or dry etching until the source 101 and drain 102 regions contain the desired amount of heavily doped P+ diamond, as shown in FIG. 5B. The contacts to the P− channel regions of channel 103 can be significantly reduced by incorporating the heavily doped P+ diamond layers in the source 101 and/or drain 102. Following the ohmic regrowth of the source 101 and drain 102, the gate dielectric 109 can be deposited onto the gated channel 106 by atomic layer deposition or other methods as shown in FIG. 5C. The deposition can be conformal such that some or all of the surfaces/faces of the fin 107 are covered by dielectric layer 109. A final step can comprise forming a gate 104 on the top and side faces of dielectric layer 109 formed on the faces of channel 103, as partially shown in FIG. 5D. To conformably wrap gate 104 around the sidewalls of the fin 107, aluminum can be sputtered with a photoresist in front of the desired regions of the transistor (e.g. regions not intended to be covered by aluminum such as: source 101, drain 102, and regions of dielectric layer 109) to ensure a proper lift-off of the aluminum in the desired regions. The metal or conductive contacts 610 to the P+ layers can be fabricated to make ideal ohmic contacts. The illustrated process described here features a metal-oxide semiconductor (MOS) styled gated channel, though other channel types can be fabricated using these methods such as, for example, a Schottky gated channel. The fabrication steps described herein can be performed in any suitable order.

In a Schottky gated channel when using diamond, the gate must be in the channel and cannot overlap the source. With a MOS gated structure, the gate can overlap the source.

As a variation in composition, it is noted that there is symmetry present between P-type and N-type dopants such that source 101 and drain 102 regions can comprise heavily doped N-type diamond instead of comprising heavily doped P-type diamond. Additionally, channel 103 and buffer layer 310 can comprise lightly doped N-type diamond instead of comprising lightly doped P-type diamond. Substrate 105 can comprise intrinsic diamond or P-type diamond instead of comprising N-type diamond, and if substrate 105 is doped, substrate 105 can be doped at any suitable P-type dopant concentration. In this circumstance, the device is turned "on" at positive gate voltages and the drain current increases as the gate voltage increases. The current through the drift region can still be modeled according to equation (2).

As another variation, though the transistor is described as comprising doped and undoped diamond, which is a wide-band gap material, the transistor can instead comprise other doped and undoped wide-band gap materials in general. For example, the transistor can comprise doped and undoped silicon carbide instead of doped and undoped diamond. In one embodiment, source 101 and drain 102 regions can comprise heavily doped P-type silicon carbide. Channel 103 and buffer layer 310 can comprise lightly doped P-type silicon carbide. Substrate 105 can comprise intrinsic silicon carbide or N-type silicon carbide. Here, an N-type dopant can be nitrogen and a P-type dopant can be aluminum.

Further, since there is a symmetry between N-type and P-type dopants in silicon carbide, a second embodiment can include the source 101 and drain 102 regions comprising heavily doped N-type silicon carbide. Channel 103- and buffer layer 310 can comprise lightly doped N-type silicon carbide. Substrate 105 can comprise intrinsic silicon carbide or P-type silicon carbide. An N-type dopant can be nitrogen and a P-type dopant can be aluminum.

A Schottky gated channel is a gated channel that is in direct electrical contact with a metal gate. For an embodiment that includes a Schottky gated channel instead of a MOS styled gated channel, the transistor does not comprise dielectric layer 109, and gate structure 104 is in contact with gated channel 106. At positive gate voltages, holes are repelled from the gate-channel interface and the gated channel 106 can be pinched off. At sufficiently large negative gate voltages, holes are attracted to the gate-channel interface and current can leak through gate structure 104 since the Schottky barrier at the gate-channel interface does not prevent holes from flowing into the gate structure. As a result, the transistor having a Schottky gated channel is limited to operating at relatively small negative gate voltages which imposes a constraint on the channel conduction and therefore also on the performance of the transistor.

In a sample created by the inventors, a 3×3 undoped diamond substrate was used with an epitaxially grown P+/P− bilayer on top of the diamond substrate. The P+ layer was patterned and dry etched to define the ohmic area and also to expose the channel area. Titanium/Platinum/Gold (Ti/Pt/Au) was evaporated to form a good ohmic contact after 525 degrees centigrade annealing. E-beam lithography and O2 plasma dry etching were used subsequently to form 100 nm wide and 2 micro meter tall fins. A silicon dioxide (SiO$_2$) gate dielectric was deposited by atomic layer deposition at 200 degrees centigrade. To conformally wrap the gate around the sidewalls of the fins, aluminum (Al) metal was sputtered with a photoresist in place. The metal was then lifted off. Only 100 nm of Al was used to ensure successful liftoff by sputtering. Finally, the ohmic contact pads were open with wet etching.

Modulation by the gate validates the concept of a fin-based diamond electronic device.

Although example embodiments are illustrated, the technology herein presented can be implemented using any number of techniques, whether currently known or not. The technology is not limited to the example embodiments.

Modifications, additions, or omissions can be made to the systems, apparatuses, and methods described herein without departing from the scope of the technology. The components of the systems and apparatuses can be integrated or separated. Moreover, the operations of the systems and apparatuses can be performed by more, fewer, or other components. The methods can include more, fewer, or other steps. Additionally, steps can be performed in any suitable order. As used in this document, "each" refers to each member of a set or each member of a subset of a set.

At least the following concepts have been presented in the foregoing writing.

Concepts

Concept 1. A diamond based lateral device with a fin-like channel is presented according to any of the following concepts. The device is comprised of a gated channel and a drift region. The current transport through the drift region is space charge limited.

Concept 2. The device of any of the preceding or following concepts, wherein the gate may or may not overlap the source.

Concept 3. The device of any of the preceding or following concepts, wherein the gate may or may not overlap the drain.

Concept 4. The device of any of the preceding or following concepts, wherein the source/drain P+ layer may be separated from the device substrate by a buffer layer.

Concept 5. The device of any of the preceding or following concepts, wherein the substrate may be an N type diamond or just an intrinsic diamond.

Concept 6. The device of any of the preceding or following concepts, wherein the gated channel can be a MOS gated structure or a Schottky gated structure.

Concept 7. The device of any of the preceding or following concepts, wherein the device structure can be extended to other semiconductors such as silicon, silicon carbide and other wide-band gap materials.

Concept 8. The device of any of the preceding or following concepts, wherein the device can be made of an array of single-channel devices to increase power.

Concept 9. The device of any of the preceding or following concepts, wherein making the device, ohmic regrowth is a notable option.

Concept 10. The device of any of the preceding or following concepts, wherein the heavily doped diamond layer is grown through a patterned surface to form critical ohmic contacts to the channel.

Concept 11. A lateral transistor device with a fin-like channel according to any of the preceding or following concepts, the device comprising: a gated channel and a drift region, the gated channel located in the fin-like channel near the drift region, the drift region located in the fin-like channel, wherein the current transport through the drift region is space-charge limited, the drift region determining the breakdown voltage of the transistor.

Concept 12. The device according to any of the preceding or following concepts having a source and a gate, wherein the gate overlaps the source.

Concept 13. The device according to any of the preceding or following concepts, further having a drain, wherein the gate overlaps the drain.

Concept 14. The device according to any of the preceding or following concepts having a source; a drain; a substrate; and a buffer layer; the source and the drain being electrically connected by the fin-like channel; the source, drain and fin-like channel being on the substrate, the source and the drain being doped with a P-type dopant and separated from the substrate by the buffer layer.

Concept 15. The device according to any of the preceding or following concepts having a substrate, the substrate being an N-type diamond or intrinsic diamond.

Concept 16. The device according to any of the preceding or following concepts, wherein the device is diamond based.

Concept 17. The device according to any of the preceding or following concepts, wherein the source, drain, and fin-like channel comprise at least one of silicon carbide and wide-band gap materials.

Concept 18. The device according to any of the preceding or following concepts, wherein there is a plurality of fin-like channels coupled between the source and the drain.

Concept 19. The device according to any of the preceding or following concepts, wherein the gated channel is a MOS gated or Schottky gated channel.

Concept 20. The device according to any of the preceding or following concepts, wherein the fin-like channel has a rounded and/or circular cross section having a diameter that is less than or equal to 500 nm.

Concept 21. The device according to any of the preceding or following concepts, wherein the fin-like channel has a cross section that is less than or equal to 500 nm wide.

Concept 22. The device according to any of the preceding or following concepts, wherein the drift region has a drift region width and a drift region thickness, the gated channel has a gated channel width and a gated channel thickness, the widths and thicknesses of the drift region and the gated channel being each adjustable.

Concept 23. The device according to any of the preceding or following concepts, wherein the thicknesses and widths of the drift region and the gated channel are not the same in measurement.

Concept 24. The device according to any of the preceding or following concepts, wherein the gated channel current $I_h$ and the drift region current $I_{df}$ are modeled by the following equations:

$$I_h = \frac{1}{L_g} C_{ox} \mu_h \left( V_g - V_t - \frac{1}{2} V_{di} \right) V_{di} \text{ and } I_{df} = 2(V_{ds} - V_{di}) \cdot \varepsilon_s \cdot v_s \cdot \frac{t}{L_{gd}^2}$$

where $V_{di}$ is the voltage drop across the gated channel, $V_{ds}$ is the voltage drop across the fin-like channel, t is a thickness of the drift region, $L_g$ and $L_{gd}$ are gated channel length and the gate-to-drain separation, respectively, $\varepsilon_s$, is the dielectric permittivity of the channel; $v_s$ is the saturation velocity of the charge carriers (e.g. holes); $\mu_h$ is the effective channel mobility under the gate structure; $C_{ox}$ is the oxide capacitance; $V_g$ is the gate bias voltage; $V_t$ is a threshold voltage.

Concept 25. The device according to any of the preceding or following concepts, wherein the drift region current is proportional to a thickness of the drift region and inversely proportional to the square of the gate-to-drain separation distance.

Concept 26. The device according to any of the preceding or following concepts, wherein the drift region current is modeled as a space-charge limited transport wherein the drift region transport is in bulk such that the bulk mobility is typically higher than the effective channel mobility as long as the drift region can support enough conduction, the series resistance introduced by the drift region being smaller than that of the gated channel.

Concept 27. A lateral multi-gate transistor according to any of the preceding or following concepts operating at a space charge limited regime comprising a multi-gate structure to control a source-to-channel barrier to control carrier injection into the channel for current transport at the space charge limited regime, wherein the transistor is able to increase a current leakage path distance, thereby increasing a breakdown voltage without sacrificing the current conduction capability of the transistor.

Concept 28. The transistor according to any of the preceding or following concepts, wherein the transistor comprises diamond electronics Concept 29. A method of overcoming inherent large parasitic capacitance in a vertical static induction transistor (SIT) according to any of the preceding or following concepts, wherein gate-to-source and gate-to-drain parasitic capacitances and a lateral structure are engineered using a multi-gate structure, the conduction channel being regulated by wrapping the multi-gate structure around the channel, the multi-gate structure enabling a material agnostic SIT.

Concept 30. A transistor device according to any of the preceding or following concepts having a fin-like channel having three faces and associated with a diamond substrate; a multiple gate structure formed on the faces of the fin-like channel, the source and drain of the transistor being diamond, the fin-like channel being between the source and drain, the gate enabling control of the current between the source and the drain through the fin-like channel to enable pinching off the current.

Concept 31. A transistor according to any of the preceding or following concepts, comprising:

source and drain regions disposed on a substrate;

a semi conductive fin disposed on the substrate between the source and drain regions;

a gate structure and a dielectric layer associated with the fin, the fin having at least one face covered by the gate structure and dielectric layer, the dielectric layer electrically insulating the gate structure from the fin; wherein the source and drain regions comprise diamond doped with a P-type dopant, and the semi conductive fin comprises diamond doped with a P-type dopant, wherein the P-type dopant concentration of the semi conductive fin is less than the P-type dopant concentration of the source and drain regions.

Concept 32. The transistor according to any of the preceding or following concepts, wherein the source and drain regions comprise P-type diamond doped at a first amount; and wherein the semi conductive fin comprises P-type diamond doped at a second amount, the second amount being less than the first amount.

Concept 33. The transistor according to any of the preceding or following concepts, wherein the P-type diamond doped at the first amount is diamond doped with a boron concentration of at least $10^{19}$ cm$^{-3}$; and the P-type diamond doped at the second amount is diamond doped with a boron concentration of $10^{18}$ cm$^{-3}$ or less.

Concept 34. A transistor according to any of the preceding or following concepts, comprising a source region, a drain region, a buffer layer and a semi conductive substrate, the source and drain regions being next to the buffer layer disposed on the semi conductive substrate;

a semi conductive channel formed between the source and drain regions, a portion of the semi conductive channel comprising a fin;

a gate structure covering a surface of the fin, the semi conductive channel further comprising a drift region coupled between the fin and the drain region, wherein:

the source and drain regions comprise a semiconductor doped at a first amount;

the buffer layer comprises a semiconductor doped at a second amount that is less than the first amount;

the semi conductive channel comprises a semiconductor doped at a third amount.

Concept 35. The transistor according to any of the preceding or following concepts, wherein the semiconductor doped at the first amount is a semiconductor that is doped with a P-type dopant, the semiconductor doped at the second amount is a semiconductor that is doped with a P-type dopant, and the semiconductor doped at the third amount is a semiconductor that is doped with a P-type dopant.

Concept 36. The transistor according to any of the preceding or following concepts, wherein the semiconductor doped at the first amount is diamond doped with a boron concentration of at least $10^{19}$ cm$^{-3}$.

Concept 37. The transistor according to any of the preceding or following concepts, wherein the semiconductor doped at the second amount is diamond doped with a boron concentration of $10^{18}$ cm$^{-3}$ or less; and wherein the semiconductor doped at the third amount is diamond doped with a boron concentration of $10^{18}$ cm$^{-3}$ or less.

Concept 38. The transistor according to any of the preceding or following concepts, wherein the semiconductor doped at the first amount is silicon or silicon carbide doped with an aluminum concentration of at least $10^{19}$ cm$^{-3}$.

Concept 39. The transistor according to any of the preceding or following concepts, wherein the semiconductor doped at the second amount is silicon or silicon carbide doped with an aluminum concentration of $10^{18}$ cm$^{-3}$ or less; and wherein the semiconductor doped at the third amount is silicon or silicon carbide doped with an aluminum concentration of $10^{18}$ cm$^{-3}$ or less.

Concept 40. The transistor according to any of the preceding or following concepts, wherein the semiconductor doped at the first amount is diamond that is doped with an N-type dopant, the semiconductor doped at the second amount is diamond that is doped with an N-type dopant, and the semiconductor doped at the third amount is diamond that is doped with an N-type dopant, wherein the second amount is less than the first amount, and the third amount is less than the first amount.

Concept 41. The transistor according to any of the preceding or following concepts, wherein the drift region has a drift region width and the fin region has a fin width, wherein the drift region width is greater than the fin width.

Concept 42. A transistor according to any of the preceding or following concepts, comprising:

source and drain regions;

a semi conductive fin electrically coupled between the source and drain regions of the transistor;

a substrate associated with the source and drain regions, and the semiconductor fin;

a gate structure and a dielectric layer associated with the fin, the fin having at least one face covered by the gate structure and the dielectric layer, the dielectric layer electrically insulating the gate structure from the fin; wherein the source and drain regions comprise diamond doped with an N-type dopant, and the semi conductive fin comprises diamond doped with an N-type dopant, wherein the N-type dopant concentration of the semi conductive fin is less than the N-type dopant concentration of the source and drain regions.

Concept 43. The transistor according to any of the preceding or following concepts, wherein the source and drain regions comprise N-type diamond doped at a first amount; and wherein the semi conductive fin comprises N-type diamond doped at a second amount, the second amount being less than the first amount.

Concept 44. The transistor according to any of the preceding or following concepts, wherein the N-type dopant is phosphorus and/or nitrogen.

Concept 45. The transistor according to any of the preceding concepts, wherein the N-type diamond doped at a first amount is diamond doped with an N-type dopant concentration of at least $10^{19}$ cm$^{-3}$; and the N-type diamond doped at the second amount is diamond doped with an N-type dopant concentration of $10^{18}$ cm$^{-3}$ or less.

As a broad overview, this writing presents at least the following.

Presented is a lateral fin static induction transistor having a semi conductive substrate, source and drain regions extending from an optional buffer layer of same or varied thickness supported by a semi conductive substrate, a semi conductive channel electrically coupling the source region to the drain region of the transistor, a portion of the semi conductive channel being a fin and having a face covered by a gate structure, thereby defining a gated channel within the semi conductive channel, the semi conductive channel further including a drift region electrically coupling the gated channel to the drain region of the transistor.

What is claimed is:

1. A lateral transistor device with a fin-like channel, the device comprising:

a gated channel and a drift region, the gated channel located in the fin-like channel near the drift region, the drift region located in the fin-like channel, wherein the current transport through the drift region is space charge limited, the drift region determining the breakdown voltage of the transistor;

a source; a drain, and a substrate;

the source and the drain being electrically connected by the fin-like channel;

the source, the drain, and fin-like channel being on the substrate;

the source, drain, and fin-like channel being of a first conductivity type.

2. The device of claim 1 having a gate, wherein the gate overlaps the source.

3. The device of claim 2, wherein the gate overlaps the drain.

4. The device of claim 1, a buffer layer; wherein said first conductivity type is P-type, and wherein the source and drain are separated from the substrate by the buffer layer.

5. The device of claim 1, wherein the substrate is N-type diamond or intrinsic diamond.

6. The device of claim 1, wherein the device is diamond based.

7. The device of claim 1 wherein the source, drain, and fin-like channel comprise at least one of silicon carbide and wide-band gap materials.

8. The device of claim 1 wherein there is a plurality of fin-like channels coupled between the source and the drain.

9. The device of claim 1 wherein the gated channel is a MOS gated or Schottky gated channel.

10. The device of claim 1, wherein the fin-like channel has a rounded cross section having a diameter that is less than or equal to 500 nm.

11. The device of claim 1, wherein the fin-like channel has a cross section that is less than or equal to 500 nm wide.

12. The device of claim 1, wherein the drift region and the gated channel have thicknesses and widths, wherein the thicknesses and widths of the drift region and the gated channel are not the same in measurement.

13. The device of claim 4 wherein the gated channel current $I_h$ and the drift region current $I_{df}$ are modeled by the following equations:

$$I_h = \frac{1}{L_g} C_{ox} \mu_h \left( V_g - V_t - \frac{1}{2} V_{di} \right) V_{di} \text{ and } I_{df} = 2(V_{dx} - V_{di}) \cdot \varepsilon_s \cdot v_s \cdot \frac{t}{L_{gd}^2}$$

where $V_{di}$ is the voltage drop across the gated channel, $V_{ds}$ is the voltage drop across the fin-like channel, t is a thickness of the drift region, $L_g$ and $L_{gd}$ are gated channel length and the gate-to-drain separation, respectively, $\varepsilon_s$ is the dielectric permittivity of the channel; $v_s$ is the saturation velocity of the charge carriers (e.g. holes); $\mu_h$ is the effective channel mobility under the gate structure; $C_{ox}$ is the oxide capacitance; $V_g$ is the gate bias voltage; $V_t$ is a threshold voltage.

14. The device of claim 4, wherein the drift region current is proportional to a thickness of the drift region and inversely proportional to the square of the gate-to-drain separation distance.

* * * * *